(12) United States Patent
Miyairi

(10) Patent No.: US 9,257,561 B2
(45) Date of Patent: Feb. 9, 2016

(54) SEMICONDUCTOR DEVICE AND MANUFACTURING METHOD THEREOF

(71) Applicant: SEMICONDUCTOR ENERGY LABORATORY CO., LTD., Atsugi-shi, Kanagawa-ken (JP)

(72) Inventor: Hidekazu Miyairi, Kanagawa (JP)

(73) Assignee: Semiconductor Energy Laboratory Co., LTD., Kanagawa-ken (JP)

( * ) Notice: Subject to any disclaimer, the term of this patent is extended or adjusted under 35 U.S.C. 154(b) by 0 days.

(21) Appl. No.: 14/251,764

(22) Filed: Apr. 14, 2014

(65) Prior Publication Data

US 2014/0217413 A1    Aug. 7, 2014

Related U.S. Application Data

(63) Continuation of application No. 13/212,391, filed on Aug. 18, 2011, now Pat. No. 8,704,230.

(30) Foreign Application Priority Data

Aug. 26, 2010   (JP) ................. 2010-189927

(51) Int. Cl.
*H01L 29/02*      (2006.01)
*H01L 29/786*     (2006.01)
*H01L 29/04*      (2006.01)

(52) U.S. Cl.
CPC .......... *H01L 29/78645* (2013.01); *H01L 29/04* (2013.01); *H01L 29/78618* (2013.01); *H01L 29/78648* (2013.01); *H01L 29/78672* (2013.01); *H01L 29/78696* (2013.01)

(58) Field of Classification Search
None
See application file for complete search history.

(56) References Cited

U.S. PATENT DOCUMENTS

| 4,242,156 A | 12/1980 | Peel |
| 4,409,134 A | 10/1983 | Yamazaki |

(Continued)

FOREIGN PATENT DOCUMENTS

| DE | 197 36 204 B4 | 2/1998 |
| EP | 0 532 314 A1 | 3/1993 |

(Continued)

OTHER PUBLICATIONS

Song.J et al., "34.1: Advanced Four-Mask Process Architecture for the A-Si TFT Array Manufacturing Method,", SID Digest '02: SID International Symposium Digest of Technical Papers, 2002, vol. 33, pp. 1038-1041.

(Continued)

*Primary Examiner* — Fei Fei Yeung Lopez
(74) *Attorney, Agent, or Firm* — Nixon Peabody LLP; Jeffrey L. Costellia

(57) ABSTRACT

To reduce parasitic capacitance between a gate electrode and a source electrode or drain electrode of a dual-gate transistor. A semiconductor device includes a first insulating layer covering a first conductive layer; a first semiconductor layer, second semiconductor layers, and an impurity semiconductor layer sequentially provided over the first insulating layer; a second conductive layer over and at least partially in contact with the impurity semiconductor layer; a second insulating layer over the second conductive layer; a third insulating layer covering the three semiconductor layers, the second conductive layer, and the second insulating layer; and a third conductive layer over the third insulating layer. The third conductive layer overlaps with a portion of the first semiconductor layer, which does not overlap with the second semiconductor layers, and further overlaps with part of the second conductive layer.

19 Claims, 10 Drawing Sheets

(56) References Cited

U.S. PATENT DOCUMENTS

| | | |
|---|---|---|
| 4,581,620 A | 4/1986 | Yamazaki et al. |
| 5,101,242 A | 3/1992 | Ikeda et al. |
| 5,221,631 A | 6/1993 | Ikeda et al. |
| 5,262,654 A | 11/1993 | Yamazaki |
| RE34,658 E | 7/1994 | Yamazaki et al. |
| 5,414,442 A | 5/1995 | Yamazaki et al. |
| 5,453,858 A | 9/1995 | Yamazaki |
| 5,514,879 A | 5/1996 | Yamazaki |
| 5,571,578 A | 11/1996 | Kaji et al. |
| 5,591,987 A | 1/1997 | Yamazaki et al. |
| 5,614,732 A | 3/1997 | Yamazaki |
| 5,648,662 A | 7/1997 | Zhang et al. |
| 5,650,339 A | 7/1997 | Saito et al. |
| 5,652,453 A | 7/1997 | Iwamatsu et al. |
| 5,656,825 A | 8/1997 | Kusumoto et al. |
| 5,677,236 A | 10/1997 | Saitoh et al. |
| 5,701,167 A | 12/1997 | Yamazaki |
| 5,726,461 A | 3/1998 | Shimada et al. |
| 5,728,259 A | 3/1998 | Suzawa et al. |
| 5,766,989 A | 6/1998 | Maegawa et al. |
| 5,773,330 A | 6/1998 | Park |
| 5,835,172 A | 11/1998 | Yeo et al. |
| 5,849,601 A | 12/1998 | Yamazaki |
| 5,859,445 A | 1/1999 | Yamazaki |
| 5,864,150 A | 1/1999 | Lin |
| 5,932,302 A | 8/1999 | Yamazaki et al. |
| 5,989,998 A | 11/1999 | Sugahara et al. |
| 6,010,922 A | 1/2000 | Hata et al. |
| 6,011,277 A | 1/2000 | Yamazaki |
| 6,013,930 A | 1/2000 | Yamazaki et al. |
| 6,023,075 A | 2/2000 | Yamazaki |
| 6,030,873 A | 2/2000 | Iwamatsu et al. |
| 6,087,698 A | 7/2000 | Saito et al. |
| 6,091,467 A | 7/2000 | Kubo et al. |
| 6,100,558 A | 8/2000 | Krivokapic et al. |
| 6,104,065 A | 8/2000 | Park |
| 6,121,660 A | 9/2000 | Yamazaki et al. |
| 6,153,893 A | 11/2000 | Inoue et al. |
| 6,171,674 B1 | 1/2001 | Yamazaki et al. |
| 6,183,816 B1 | 2/2001 | Yamazaki et al. |
| 6,218,219 B1 | 4/2001 | Yamazaki et al. |
| 6,252,249 B1 | 6/2001 | Yamazaki |
| 6,281,520 B1 | 8/2001 | Yamazaki |
| 6,306,213 B1 | 10/2001 | Yamazaki |
| 6,387,737 B1 | 5/2002 | Yamazaki et al. |
| 6,388,291 B1 | 5/2002 | Zhang et al. |
| 6,426,245 B1 | 7/2002 | Kawasaki et al. |
| 6,433,361 B1 | 8/2002 | Zhang et al. |
| 6,468,617 B1 | 10/2002 | Yamazaki et al. |
| 6,468,839 B2 | 10/2002 | Inoue et al. |
| 6,495,386 B2 | 12/2002 | Powell |
| 6,498,369 B1 | 12/2002 | Yamazaki et al. |
| 6,555,843 B1 | 4/2003 | Yamazaki et al. |
| 6,558,756 B2 | 5/2003 | Sugahara et al. |
| 6,559,548 B1 | 5/2003 | Matsunaga et al. |
| 6,693,044 B1 | 2/2004 | Yamazaki et al. |
| 6,737,676 B2 | 5/2004 | Yamazaki |
| 6,744,008 B1 | 6/2004 | Kasahara et al. |
| 6,756,258 B2 | 6/2004 | Zhang et al. |
| 6,835,523 B1 | 12/2004 | Yamazaki et al. |
| 6,864,583 B2 | 3/2005 | Matsunaga et al. |
| 6,876,039 B2 | 4/2005 | Okihara |
| 7,060,323 B2 | 6/2006 | Sugahara et al. |
| 7,067,844 B2 | 6/2006 | Yamazaki |
| 7,067,845 B2 | 6/2006 | Murakami et al. |
| 7,098,479 B1 | 8/2006 | Yamazaki |
| 7,102,718 B1 | 9/2006 | Yamazaki et al. |
| 7,115,902 B1 | 10/2006 | Yamazaki |
| 7,115,903 B2 | 10/2006 | Isobe et al. |
| 7,157,358 B2 | 1/2007 | Hall et al. |
| 7,164,171 B2 | 1/2007 | Yamazaki et al. |
| 7,183,211 B2 | 2/2007 | Konno et al. |
| 7,199,846 B2 | 4/2007 | Lim |
| 7,211,825 B2 | 5/2007 | Shih et al |
| 7,259,429 B2 | 8/2007 | Yamazaki |
| 7,365,805 B2 | 4/2008 | Maekawa et al. |
| 7,465,677 B2 | 12/2008 | Isobe et al. |
| 7,611,930 B2 | 11/2009 | Yamazaki et al. |
| 7,718,547 B2 | 5/2010 | Isobe et al. |
| 7,888,167 B2 | 2/2011 | Yamazaki et al. |
| 8,017,946 B2 | 9/2011 | Yamazaki et al. |
| 8,198,629 B2 | 6/2012 | Yamazaki et al. |
| 8,395,158 B2 | 3/2013 | Yamazaki et al. |
| 2002/0009890 A1 | 1/2002 | Hayase et al. |
| 2002/0055209 A1 | 5/2002 | Kusumoto et al. |
| 2002/0119590 A1 | 8/2002 | Flewitt |
| 2004/0026696 A1 | 2/2004 | Yamazaki et al. |
| 2004/0113214 A1 | 6/2004 | Takenaka |
| 2004/0206956 A1 | 10/2004 | Yanai et al. |
| 2005/0012097 A1 | 1/2005 | Yamazaki |
| 2005/0012151 A1 | 1/2005 | Yamaguchi et al. |
| 2005/0022864 A1 | 2/2005 | Fujioka et al. |
| 2005/0062129 A1 | 3/2005 | Komatsubara |
| 2005/0115930 A1 | 6/2005 | Tanaka et al. |
| 2005/0116305 A1 | 6/2005 | Hwang et al. |
| 2006/0049449 A1 | 3/2006 | Iino et al. |
| 2006/0113894 A1 | 6/2006 | Fujii et al. |
| 2007/0034871 A1 | 2/2007 | Itoh et al. |
| 2007/0045627 A1 | 3/2007 | Park et al. |
| 2007/0080374 A1 | 4/2007 | Kurokawa |
| 2007/0123035 A1 | 5/2007 | Sugimoto et al. |
| 2007/0176176 A1 | 8/2007 | Yamazaki et al. |
| 2007/0181945 A1 | 8/2007 | Nakamura |
| 2007/0187678 A1 | 8/2007 | Hirao et al. |
| 2007/0252179 A1 | 11/2007 | Isobe et al. |
| 2007/0281400 A1 | 12/2007 | Yamazaki et al. |
| 2008/0128703 A1 | 6/2008 | Ikeda et al. |
| 2008/0128808 A1 | 6/2008 | Yamazaki et al. |
| 2008/0132066 A1 | 6/2008 | Phan et al. |
| 2009/0001375 A1 | 1/2009 | Yamazaki et al. |
| 2009/0002591 A1 | 1/2009 | Yamazaki et al. |
| 2009/0026454 A1 | 1/2009 | Kurokawa et al. |
| 2009/0033818 A1 | 2/2009 | Nakajima et al. |
| 2009/0045409 A1 | 2/2009 | Yamazaki et al. |
| 2009/0047775 A1 | 2/2009 | Yamazaki et al. |
| 2009/0057683 A1 | 3/2009 | Nakajima et al. |
| 2009/0061574 A1 | 3/2009 | Nakajima et al. |
| 2009/0140250 A1 | 6/2009 | Yamazaki et al. |
| 2009/0140251 A1 | 6/2009 | Yamazaki |
| 2009/0152550 A1 | 6/2009 | Ohnuma et al. |
| 2009/0315044 A1 | 12/2009 | Amundson et al. |
| 2009/0321737 A1 | 12/2009 | Isa et al. |
| 2010/0012946 A1 | 1/2010 | Zhi et al. |
| 2010/0051922 A1 | 3/2010 | Hotta et al. |
| 2010/0117076 A1 | 5/2010 | Akimoto et al. |
| 2010/0133541 A1 | 6/2010 | Uchida et al. |
| 2010/0148177 A1 | 6/2010 | Koyama et al. |
| 2010/0301346 A1 | 12/2010 | Miyairi et al. |
| 2011/0042667 A1 | 2/2011 | Kawamura et al. |
| 2011/0101331 A1* | 5/2011 | Yamazaki et al. .............. 257/43 |
| 2011/0121300 A1 | 5/2011 | Miyairi et al. |
| 2011/0147745 A1 | 6/2011 | Sasagawa et al. |
| 2011/0147755 A1 | 6/2011 | Miyairi et al. |
| 2012/0025191 A1 | 2/2012 | Yamazaki |

FOREIGN PATENT DOCUMENTS

| | | |
|---|---|---|
| EP | 0 535 979 A2 | 4/1993 |
| EP | 0 826 791 A2 | 3/1998 |
| EP | 1 045 447 A2 | 10/2000 |
| EP | 1 050 599 A2 | 11/2000 |
| EP | 1 182 275 A2 | 2/2002 |
| EP | 1 207 217 A1 | 5/2002 |
| EP | 1 333 476 A2 | 8/2003 |
| EP | 1 536 482 A1 | 6/2005 |
| EP | 1717847 A | 11/2006 |
| JP | 57-071126 | 5/1982 |
| JP | 58-092217 | 6/1983 |
| JP | 59-072781 | 4/1984 |
| JP | 59-150469 | 8/1984 |
| JP | 60-177676 A | 9/1985 |
| JP | 01-117068 | 5/1989 |
| JP | 01-191479 A | 8/1989 |
| JP | 04-242724 | 8/1992 |

(56) References Cited

FOREIGN PATENT DOCUMENTS

| | | |
|---|---|---|
| JP | 04-266019 | 9/1992 |
| JP | 05-129608 | 5/1993 |
| JP | 06-037313 | 2/1994 |
| JP | 06-326312 | 11/1994 |
| JP | 07-064108 A | 3/1995 |
| JP | 07-131030 | 5/1995 |
| JP | 07-176753 | 7/1995 |
| JP | 07-211708 | 8/1995 |
| JP | 07-335906 | 12/1995 |
| JP | 08-018055 | 1/1996 |
| JP | 08-125195 | 5/1996 |
| JP | 08-153699 | 6/1996 |
| JP | 08-335702 | 12/1996 |
| JP | 09-023010 | 1/1997 |
| JP | H09-512667 | 12/1997 |
| JP | 10-020298 | 1/1998 |
| JP | 11-121761 | 4/1999 |
| JP | 11-258636 | 9/1999 |
| JP | 2000-077665 | 3/2000 |
| JP | 2000-277439 | 10/2000 |
| JP | 2001-007024 | 1/2001 |
| JP | 2001-053283 | 2/2001 |
| JP | 2001-217424 A | 8/2001 |
| JP | 3474286 | 12/2003 |
| JP | 2004-014958 | 1/2004 |
| JP | 2005-019859 | 1/2005 |
| JP | 2005-049832 | 2/2005 |
| JP | 2005-167051 | 6/2005 |
| JP | 2005-167207 | 6/2005 |
| JP | 2005-183774 | 7/2005 |
| JP | 2005-191546 | 7/2005 |
| JP | 2006-332634 A | 12/2006 |
| JP | 2008-124392 | 5/2008 |
| JP | 2009-044134 | 2/2009 |
| JP | 2009-295997 A | 12/2009 |
| JP | 2010-123925 A | 6/2010 |
| JP | 2010-135384 A | 6/2010 |
| WO | WO 2004/086487 A1 | 10/2004 |

OTHER PUBLICATIONS

Kim.C et al., "42.1: A Novel Four-Mask-Count Process Architecture for TFT-LCDS,", SID Digest '00 : SID International Symposium Digest of Technical Papers, 2000, vol. 31, pp. 1006-1009.

Fujiwara.H et al., "Real-time spectroscopic ellipsometry studies of the nucleation and grain growth processes in microcrystalline silicon thin films,", Phys. Rev. B (Physical Review. B), Feb. 23, 2001, vol. 63, pp. 115306-1-115306-9.

Arai.T et al., "41.2: Micro Silicon Technology for Active Matrix OLED Display,", SID Digest '07 : SID International Symposium Digest of Technical Papers, 2007, vol. 38, pp. 1370-1373.

Fujiwara.H et al., "Microcrystalline silicon nucleation sites in the sub-surface of hydrogenated amorphous silicon,", Surface Science, 2002, vol. 497, No. 1-3, pp. 333-340.

Fujiwara.H et al., "Stress-Induced Nucleation of Microcrystalline Silicon from Amorphous Phase,", Jpn. J. Appl. Phys. (Japanese Journal of Applied Physics), May 15, 2002, vol. 41, Part 1, No. 5A, pp. 2821-2828.

Kamei.T et al., "A Significant Reduction of Impurity Contents in Hydrogenated Microcrystalline Silicon Films for Increased Grain Size and Reduced Defect Density,", Jpn. J. Appl. Phys. (Japanese Journal of Applied Physics), Mar. 1, 1998, vol. 37, Part 2, No. 3A, pp. L265-L268.

Lee.C et al., "How to Achieve High Mobility Thin Film Transistors by Direct Deposition of Silicon Using 13.56 MHZ RF PECVD?", IEDM 06: Technical Digest of International Electron Devices Meeting, Dec. 11, 2006, pp. 295-298.

Lee.C et al., "Directly Deposited Nanocrystalline Silicon Thin-Film Transistors With Ultra High Mobilities,", Appl. Phys. Lett. (Applied Physics Letters), Dec. 18, 2006, vol. 89, No. 25, pp. 252101-1-252101-3.

Choi.S et al., "P-16: Novel Four-Mask Process in the FFS TFT-LCD With Optimum Multiple-Slit Design Applied by the Use of a Gray-Tone Mask,", SID Digest '05 : SID International Symposium Digest of Technical Papers, 2005, vol. 36, pp. 284-287.

Lee.C et al., "High-Mobility Nanocrystalline Silicon Thin-Film Transistors Fabricated by Plasma-Enhanced Chemical Vapor Deposition,", Appl. Phys. Lett. (Applied Physics Letters), May 24, 2005, vol. 86, pp. 222106-1-222106-3.

Lee.C et al., "High-Mobility N-Channel and P-Channel Nanocrystalline Silicon Thin-Film Transistors,", IEDM 05: Technical Digest of International Electron Devices Meeting, 2005, pp. 937-940.

Esmaeili-Rad.M et al., "High Stability, Low Leakage Nanocrystalline Silicon Bottom Gate Thin Film Transistors for AMOLED Displays,", IEDM 06: Technical Digest of International Electron Devices Meeting, 2006, pp. 303-306.

Lee.H et al., "Leakage Current Mechanisms in Top-Gate Nanocrystalline Silicon Thin-Film Transistors,", Appl. Phys. Lett. (Applied Physics Letters), Feb. 28, 2008, vol. 92, pp. 083509-1-083509-3.

Esmaeili-Rad.M et al., "Absence of Defect State Creation in Nanocrystalline Silicon Thin-Film Transistors Deduced From Constant Current Stress Measurements,", Appl. Phys. Lett. (Applied Physics Letters), Sep. 12, 2007, vol. 91, No. 11, pp. 113511-1-113511-3.

Lee.C et al., "Stability of Nc-Si:H TFTS With Silicon Nitride Gate Dielectric,", IEEE Transactions on Electron Devices, 2007, vol. 54, No. 1, pp. 45-51.

Sazonov.A et al., "Low-Temperature Materials and Thin Film Transistors for Flexible Electronics,", Proceedings of the IEEE, Aug. 1, 2005, vol. 93, No. 8, pp. 1420-1428.

Esmaeili-Rad.M et al., "Stability of Nanocrystalline Silicon Bottom-Gate Thin-Film Transistors With Silicon Nitride Gate Dielectric,", J. Appl. Phys. (Journal of Applied Physics), Sep. 28, 2007, vol. 102, No. 6, pp. 064512-1-064512-7.

Lee.C et al., "Top-Gate TFTS Using 13.56MHZ PECVD Microcrystalline Silicon,", IEEE Electron Device Letters, Sep. 5, 2005, vol. 26, No. 9, pp. 637-639.

Lee.C et al., "Postdeposition Thermal Annealing and Material Stability of 75° C Hydrogenated Nanocrystalline Silicon Plasma-Enhanced Chemical Vapor Deposition Films,", J. Appl. Phys. (Journal of Applied Physics), Aug. 4, 2005, vol. 98, No. 3, pp. 034305-1-034305-7.

* cited by examiner

FIG. 6A1
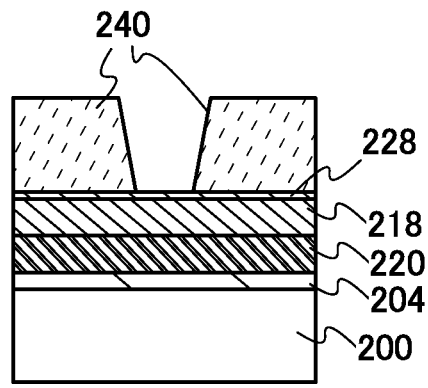
FIG. 6A2
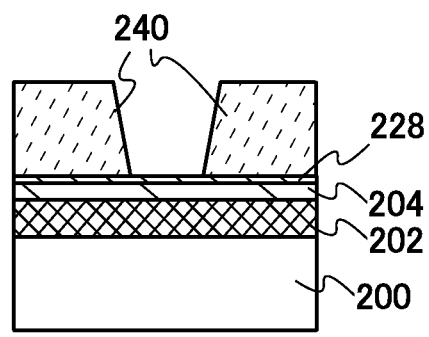
FIG. 6B1
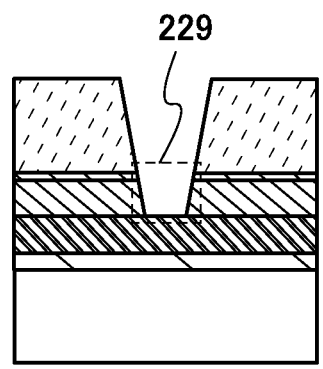
FIG. 6B2
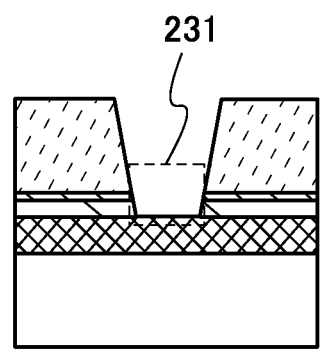
FIG. 6C1
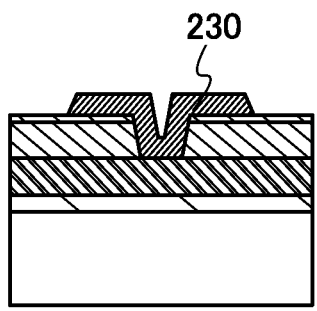
FIG. 6C2
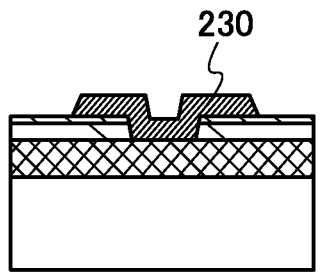

FIG. 7A1
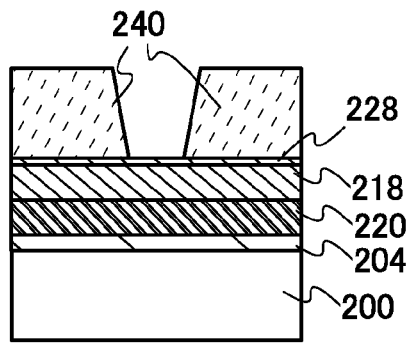
FIG. 7A2
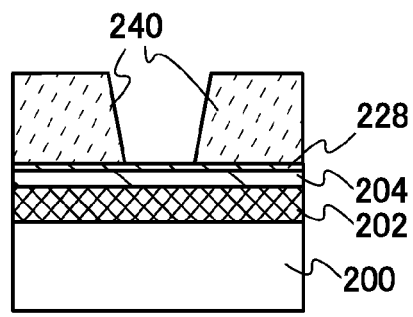
FIG. 7B1
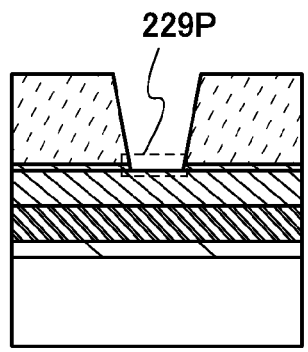
FIG. 7B2
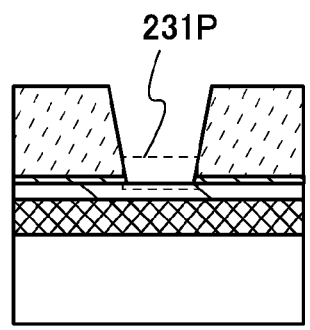
FIG. 7C1
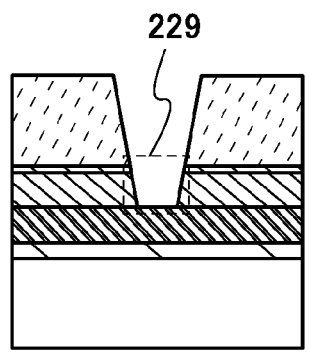
FIG. 7C2
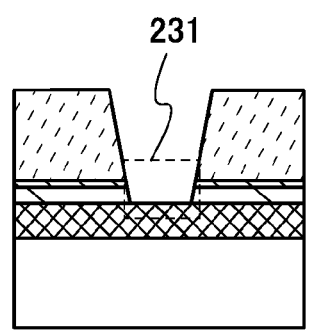
FIG. 7D1
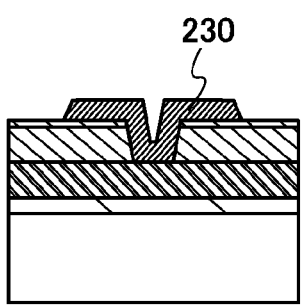
FIG. 7D2
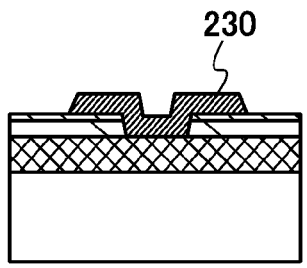

SEMICONDUCTOR DEVICE AND MANUFACTURING METHOD THEREOF

BACKGROUND OF THE INVENTION

1. Field of the Invention

Note that in this specification, a semiconductor device refers to a semiconductor element itself or a device including a semiconductor element. As an example of such a semiconductor element, for example, a thin film transistor can be given. In addition, a semiconductor device also refers to a liquid crystal display device.

2. Description of the Related Art

In recent years, semiconductor devices are indispensable to human life. A semiconductor element such as a thin film transistor included in a semiconductor device is manufactured by forming a thin film such as a semiconductor film over a substrate, and processing the thin film into a desired shape. Such a manufacturing method is used for forming a liquid crystal display device (for example, a liquid crystal television).

An amorphous silicon film has been often used as a semiconductor film in a thin film transistor of a conventional liquid crystal television. This is because a thin film transistor formed using an amorphous silicon film has a structure relatively ease to form.

However, when the current circumstances of moving images (e.g., watching movies and sports in 3D) is taken into account, sharpness of moving images in a liquid crystal television using an amorphous silicon film is insufficient; thus, a thin film transistor which responds at high speed and has high carrier mobility has been developed. Accordingly, a microcrystalline silicon film has been developed (e.g., Patent Document 1).

REFERENCE

[Patent Document 1] Japanese Published Patent Application No. 2001-217424

SUMMARY OF THE INVENTION

As disclosed in Patent Document 1, a thin film transistor using a microcrystalline silicon film as a semiconductor film can increase on-state current; however, the on-state current is not yet sufficiently high in view of the current circumstance of moving images.

Thus, as shown in FIGS. 2A and 2B, on the opposite side of a gate electrode (hereinafter which may be referred to as a first gate electrode), another gate electrode (also which may be referred to as a second gate electrode) is provided to overlap with a channel formation region so that the channel formation region is enlarged by the another gate electrode.

In a thin film transistor shown in FIG. 2A, the second gate electrode is provided to overlap with a source electrode, a drain electrode, and a channel formation region of a semiconductor layer, and an insulating layer interposed between the semiconductor layer and the second gate electrode is thin. In such a thin film transistor, large parasitic capacitance is generated between the second gate electrode, and the source electrode and the drain electrode (especially, the drain electrode).

On the contrary, when the insulating layer interposed between the semiconductor layer and the second gate electrode is thick as in a thin film transistor shown in FIG. 2B, an electric field due to the second gate electrode is weak in the semiconductor layer and it becomes difficult to improve field-effect mobility of the thin film transistor and to increase on-state current.

Thus, an object of one embodiment of the present invention is to provide a semiconductor device having a dual-gate thin film transistor, in which parasitic capacitance between a second gate electrode and at least one of a source electrode and a drain electrode in the dual-gate thin film transistor is small, and field-effect mobility and on-state current are high.

Further, one embodiment of the present invention is to provide a method for manufacturing a semiconductor device in which field-effect mobility and on-state current are high, in a simple process.

The semiconductor device according to one embodiment of the present invention includes a dual-gate thin film transistor having an inverted staggered structure. In the thin film transistor, an interlayer insulating layer is provided between a passivation layer and a conductive layer serving as a source electrode and a drain electrode, and another gate electrode is provided over the passivation layer.

In a method for manufacturing a semiconductor device that is one embodiment of the present invention, in manufacturing a dual-gate thin film transistor having an inverted staggered structure, a film to be an interlayer insulating layer provided between a passivation layer and a conductive layer serving as a source electrode and a drain electrode is stacked over a conductive film to be the source electrode and the drain electrode, and is formed with the use of an etching mask which is the same as one used for formation of the conductive layer serving as the source electrode and the drain electrode or with the use of the conductive layer serving as the source electrode and the drain electrode as an etching mask.

One embodiment of the present invention is a semiconductor device including a first insulating layer provided to cover a first conductive layer, a first semiconductor layer provided over the first insulating layer, second semiconductor layers provided over the first semiconductor layer, which are spaced from each other to expose the first semiconductor layer, an impurity semiconductor layer provided over the second semiconductor layers, a second conductive layer provided over and at least partially in contact with the impurity semiconductor layer, a second insulating layer provided over the second conductive layer, a third insulating layer provided to cover the first semiconductor layer, the second semiconductor layers, the impurity semiconductor layer, the second conductive layer, and the second insulating layer, and a third conductive layer provided at least over the third insulating layer. In the semiconductor device, the third conductive layer overlaps with a portion of the first semiconductor layer, which does not overlap with the second semiconductor layers, and further overlaps with part of the second conductive layer.

Note that the second insulating layer is the interlayer insulating layer, and the third insulating layer corresponds to the passivation layer. Further, the second conductive layer constitutes at least source and drain electrodes of the transistor, and the third conductive layer constitutes at least a second gate electrode.

In the above structure, the second insulating layer is preferably thicker than the third insulating layer so that parasitic capacitance between the second gate electrode and at least one of the source electrode and the drain electrode is reduced and field-effect mobility and on-state current are increased.

When the third conductive layer has a light-transmitting property in the above structure, a display device can be obtained.

In the above structure, it is preferable that a fourth insulating layer be provided between the third insulating layer and the third conductive layer, and the fourth insulating layer overlaps with part of the second conductive layer. The fourth insulating layer is preferably formed by a method which makes a surface substantially flat. This is because when the surface of the fourth insulating layer is substantially flat, disconnection or the like of a pixel electrode layer formed over the fourth insulating layer can be prevented. Therefore, the phrase "substantially flat" here may be at the level which can achieve the above-described purpose, and high flatness is not necessarily required.

One embodiment of the present invention is a method for manufacturing the semiconductor device, which includes the steps of forming a thin film layered body in which a first semiconductor layer, second semiconductor layers and an impurity semiconductor layer are stacked in this order over a first insulating layer provided to cover a first conductive layer, forming a conductive film to be a second conductive layer and an insulating film to be a second insulating layer so as to cover the thin film layered body, etching the insulating film to be the second insulating layer to form the second insulating layer, etching the conductive film to be the second conductive layer to form the second conductive layer, removing a portion of the impurity semiconductor layer and the second semiconductor layers, which do not overlap with the second conductive layer, to expose a portion of the first semiconductor layer, which does not overlap with the second conductive layer, forming a third insulating layer to cover the first semiconductor layer, the second semiconductor layers, the impurity semiconductor layer, the second conductive layer and the second insulating layer, and forming a third conductive layer, at least over the third insulating layer, which overlaps with a portion of the first semiconductor layer, which does not overlap with the second semiconductor layers and which overlaps with part of the second conductive layer.

In the above structure, the second insulating layer and the second conductive layer are preferably formed in the same etching process.

In the above structure, the exposed portion of the first semiconductor layer is preferably exposed to mixed gas plasma of a hydrogen gas and an oxygen gas.

Note that in the above structure, the first semiconductor layer is not necessarily provided. Alternatively, and the part of the first semiconductor layer may be formed in the same layer as the second semiconductor layer.

Note that in this specification, a pixel transistor is illustrated as a transistor for explaining a semiconductor device; however, the present invention is not limited thereto. The semiconductor device according to one embodiment of the present invention may have uses other than the pixel transistor.

Note that in this specification, a chlorine-based gas (a gas containing chlorine) or a fluorine-based gas (a gas containing fluorine) can be used for etching. As the chlorine-based gas, $BCl_3$, $Cl_2$, or the like can be given as an example; a mixed gas of $BCl_3$ and $Cl_2$ is preferably used. As the fluorine-based gas, $SF_6$ or $CF_4$ can be given as an example.

According to one embodiment of the present invention, a semiconductor device in which parasitic capacitance is small, and field-effect mobility and on-state current are high, can be obtained.

According to the method for manufacturing a thin film transistor that is one embodiment of the present invention, a semiconductor device in which parasitic capacitance is small, field-effect mobility and on-state current are high, can be obtained in a simple process.

BRIEF DESCRIPTION OF THE DRAWINGS

FIGS. 6A1, 6A2, 6B1, 6B2, 6C1, and 6C2 illustrate a method for manufacturing a semiconductor device that is one embodiment of the present invention.

FIGS. 7A1, 7A2, 7B1, 7B2, 7C1, 7C2, 7D1, and 7D2 illustrate a method for manufacturing a semiconductor device that is one embodiment of the present invention.

DETAILED DESCRIPTION OF THE INVENTION

Hereinafter, embodiments of the present invention will be described in detail with reference to the accompanying drawings. However, the present invention is not limited to the following description and it is easily understood by those skilled in the art that the mode and details can be variously changed without departing from the scope and spirit of the present invention. Accordingly, the invention should not be construed as being limited to the description of the embodiments below.

Embodiment 1

In this embodiment, a semiconductor device that is one embodiment of the present invention is described with reference to drawings.

Figure 1A:
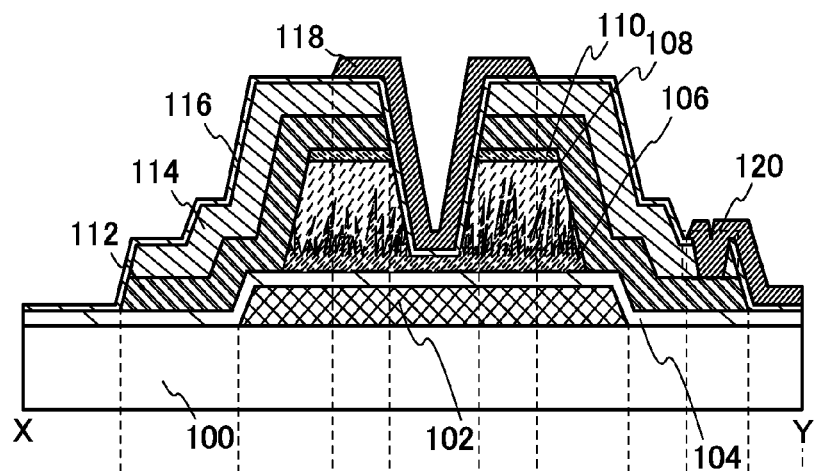
FIGS. 1A, 1B, and 1C are a cross-sectional view and top views of semiconductor devices that are one embodiment of the present invention.
Figure 1B:
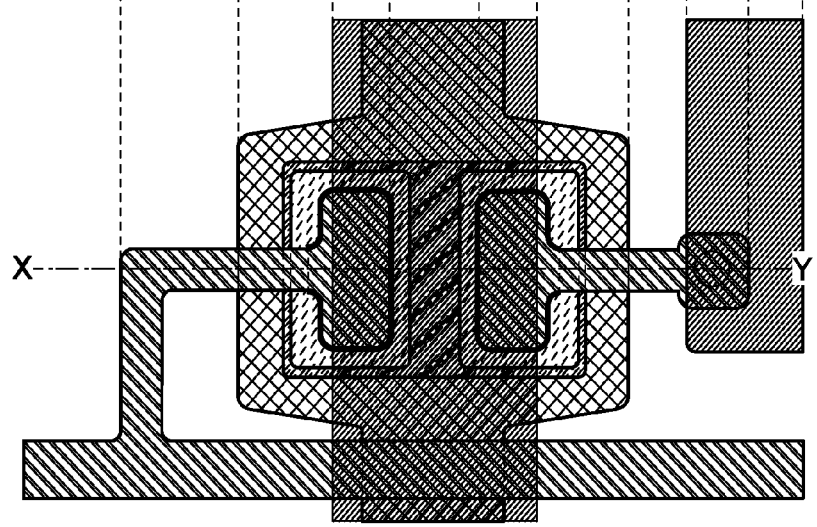
Figure 1C:
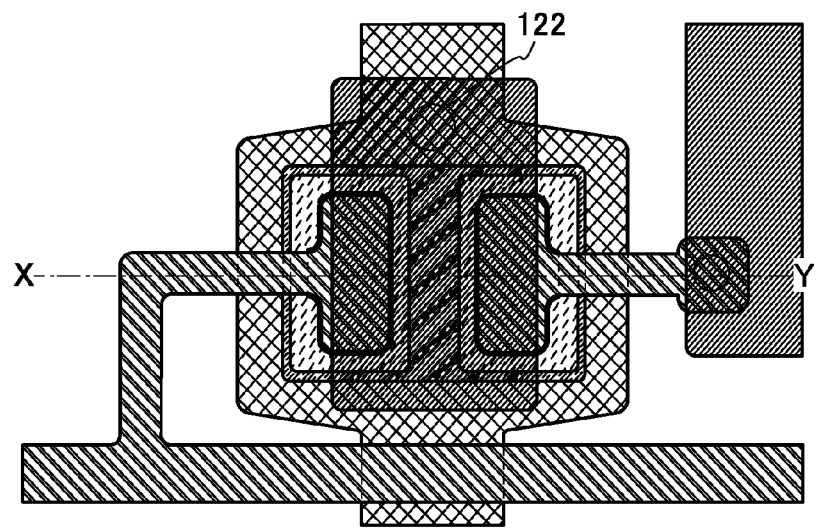

FIGS. 1A, 1B, and 1C are a cross-sectional view and top views illustrating semiconductor devices that are one embodiment of the present invention. FIG. 1A is a cross-sectional view along the line X-Y in the top view of FIG. 1B. The semiconductor device illustrated in FIGS. 1A and 1B includes a first conductive layer 102 provided over a substrate 100, a first insulating layer 104 covering the first conductive layer 102, a first semiconductor layer 106 provided over the first insulating layer 104, second semiconductor layers 108 which are spaced from each other to expose part of the first semiconductor layer 106, an impurity semiconductor layer 110 provided over the second semiconductor layers 108, a second conductive layer 112 provided over and at least partially in contact with the impurity semiconductor layer 110, a second insulating layer 114 provided only over the second conductive layer 112, a third insulating layer 116 provided to cover the first semiconductor layer 106, the second semiconductor layers 108, the impurity semiconductor layer 110, the second conductive layer 112, and the second insulating layer 114, and a third conductive layer 118 provided at least over the third insulating layer 116. The second conductive layer 112 and the third conductive layer 118 are connected in an opening portion 120.

Here, the third conductive layer 118 overlaps with a portion of the first semiconductor layer 106, which does not overlap with the second semiconductor layers 108, and also overlaps with part of the second conductive layer 112.

FIG. 1B is a top view of a mode in which a gate formed using the third conductive layer 118 is formed independently of a gate formed using the first conductive layer 102. At that time, the potential of the gate formed using the third conductive layer 118 can be different from the potential of the gate formed using the first conductive layer 102. Thus, the threshold voltage of a thin film transistor can be controlled. Note that the semiconductor device of this embodiment is not limited to this mode, and a mode illustrated in FIG. 1C may also be employed.

FIG. 1C is a top view of a mode in which the gate formed using the third conductive layer 118 is connected to the gate formed using the first conductive layer 102 in an opening portion 122. At that time, the potential of the gate formed using the third conductive layer 118 becomes equal to the potential of the gate formed using the first conductive layer 102.

Note that the first insulating layer 104, the second insulating layer 114, and the third insulating layer 116 are preferably silicon nitride layers.

Note that the first insulating layer 104, the second insulating layer 114, and the third insulating layer 116 are not limited to silicon nitride layers. Further, these insulating layers may have a layered structure including a plurality of layers. For example, the second insulating layer 114 may have a two-layer structure in which a silicon oxynitride layer is stacked on a silicon nitride layer, or may have a three-layer structure in which a silicon oxynitride layer is formed on a silicon oxide layer, and a silicon nitride layer is formed on the silicon oxynitride layer. By using a silicon oxide layer or a silicon oxynitride layer as the second insulating layer 114 as in the above examples, the second insulating layer 114 can be thinner than in the case where a silicon nitride layer is used. This is because a silicon oxide layer and a silicon oxynitride layer have lower dielectric constant than the silicon nitride layer.

Note that the gate formed using the third conductive layer 118 is not limited to the modes shown in FIGS. 1A to 1C. The gate formed using the third conductive layer 118 may have a gate electrode and a gate wiring in different layers. Alternatively, the gate electrode formed using the third conductive layer 118 and a gate wiring formed using another conductive layer which is formed over an insulating layer formed over the third conductive layer 118 may be used.

Further alternatively, only the gate may be formed using the third conductive layer 118, and a pixel electrode formed using a conductive layer different from the third conductive layer 118 may be provided.

In the semiconductor devices shown in FIGS. 1A to 1C, parasitic capacitance can be small, and field-effect mobility and on-state current can be high.

Figure 2A:
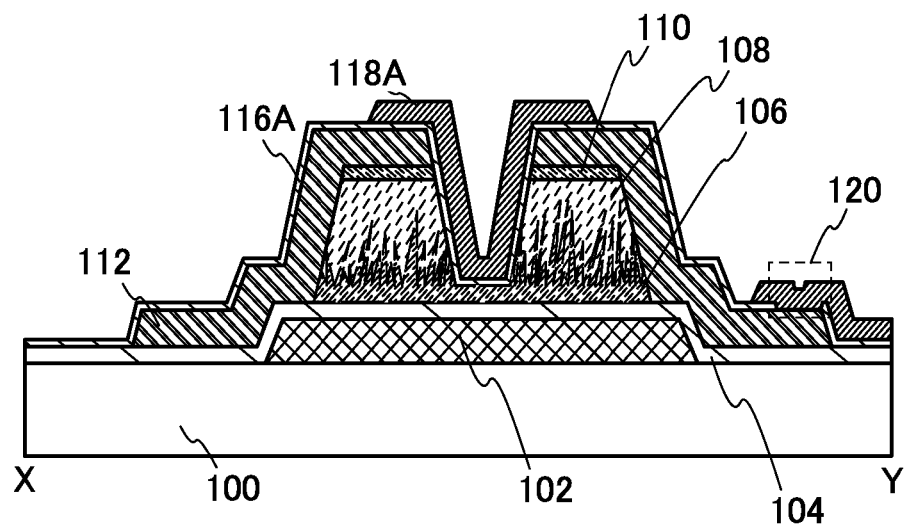
FIGS. 2A and 2B are cross-sectional views of semiconductor devices, which are comparative examples of the semiconductor devices illustrated in FIGS. 1A to 1C.

A semiconductor device shown in FIG. 2A is a comparative example of the semiconductor devices shown in FIGS. 1A to 1C. The semiconductor device shown in FIG. 2A does not include the second insulating layer shown in FIGS. 1A to 1C, and includes a third insulating layer 116A provided to cover the first semiconductor layer 106, the second semiconductor layers 108, the impurity semiconductor layer 110, the impurity semiconductor layer 110 and the second conductive layer 112, and a third conductive layer 118A provided at least over the third insulating layer 116A. Note that the third insulating layer 116A is formed with the same thickness as the third insulating layer 116 in FIG. 1A.

The semiconductor device shown in FIG. 2A can have high field-effect mobility and high on-state current as in the semiconductor device shown in FIG. 1A. However, there is a problem in that, since only the third insulating layer 116A is interposed between the second conductive layer 112 and the third conductive layer 118A in a portion in which the second conductive layer 112 and the third conductive layer 118A overlap with each other, capacitance (parasitic capacitance) of the portion becomes larger than that of the same portion in the semiconductor device shown in FIG. 1A.

Figure 2B:
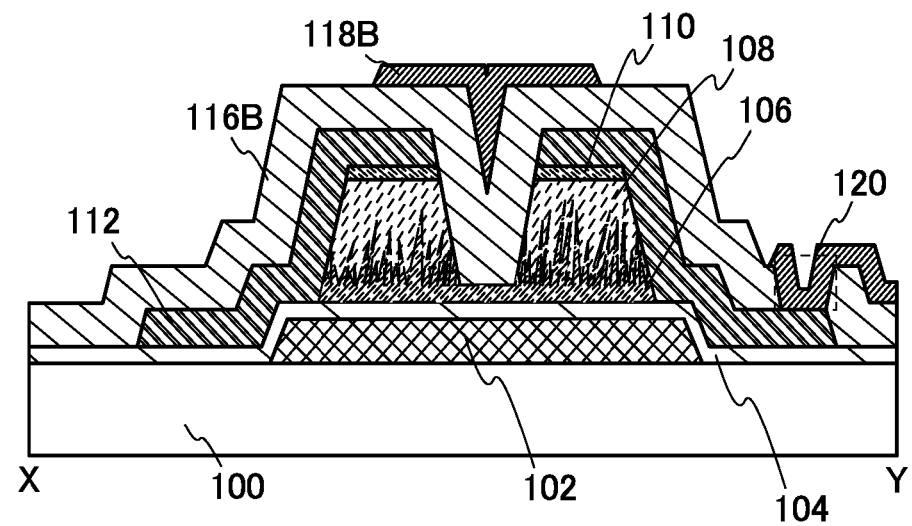

A semiconductor device shown in FIG. 2B is a comparative example of the semiconductor devices shown in FIGS. 1A to 1C. The semiconductor device shown in FIG. 2B does not include the second insulating layer shown in FIGS. 1A to 1C, and includes the third insulating layer 116B provided to cover the first semiconductor layer 106, the second semiconductor layers 108, the impurity semiconductor layer 110 and the second conductive layer 112, and a third conductive layer 118B provided at least over the third insulating layer 116B. Note that the third insulating layer 116B is formed with a thickness which is the same as the total thickness of the second insulating layer 114 and the third insulating layer 116 in FIG. 1A.

The semiconductor device shown in FIG. 2B can have smaller parasitic capacitance than the semiconductor device shown in FIG. 2A. However, the third insulating layer 116B having the thickness which is the same as the total thickness of the second insulating layer 114 and the third insulating layer 116 in FIG. 1A is interposed between the second conductive layer 112 and the third conductive layer 118B in a portion in which the second conductive layer 112 and the third conductive layer 118B overlap with each other, whereby electric field in the first semiconductor layer 106 from the gate provided using the third conductive layer 118B is weak and it is difficult to improve field-effect mobility of a thin film transistor and to increase on-state current.

Thus, by providing the second insulating layer 114 as shown in FIG. 1A, a semiconductor device in which parasitic capacitance is small, and field-effect mobility and on-state current are high can be obtained.

Although not shown in the drawing, parasitic capacitance between the pixel electrode and the source electrode or drain electrode can be reduced with the use of the second insulating layer 114; thus, parasitic capacitance between the pixel electrode and the source electrode or drain electrode can be suppressed even in the case where the pixel electrode overlaps with the source electrode and the drain electrode. The pixel electrode can overlap with the source electrode and the drain electrode; thus, the space between adjacent pixel electrodes can be made small, whereby the aperture ratio can be improved.

Embodiment 2

In this embodiment, a method for manufacturing the semiconductor devices described in Embodiments 1 is described.

Figure 3A:
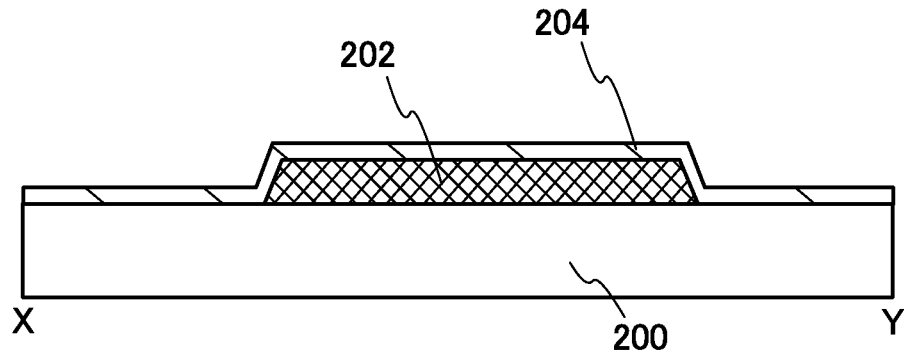
FIGS. 3A to 3C illustrate a method for manufacturing a semiconductor device that is one embodiment of the present invention.

First, a first conductive layer 202 is selectively formed over the substrate 200, and a first insulating layer 204 is formed to cover the first conductive layer 202 (FIG. 3A).

The substrate 200 is an insulating substrate. As the substrate 200, in addition to a glass substrate, a quartz substrate and a ceramic substrate, a plastic substrate or the like having heat resistance that is high enough to withstand a process temperature in this manufacturing process can be used. When the substrate 200 is a glass substrate, the substrate may have any size of the first generation (e.g., 320 mm×400 mm) to the tenth generation (e.g., 2950 mm×3400 mm); however, the substrate is not limited thereto.

The first conductive layer 202 may be selectively formed in such a manner that a conductive film (e.g., a metal film or a semiconductor film to which an impurity element imparting one conductivity type is added) is formed by a sputtering method, an etching mask is formed over the conductive film, and etching is performed using the etching mask. Alternatively, an ink-jet method may be used. Note that the conductive film to be the first conductive layer 202 may be formed to have either a single-layer structure or a layered structure including a plurality of layers. The conductive film may be formed to have a three-layer structure in which an Al layer is sandwiched between Ti layers, for example. Note that the first conductive layer 202 forms at least a scan line and a gate electrode.

The first insulating layer 204 may be formed by a plasma CVD method using an insulating material (e.g., silicon nitride, silicon nitride oxide, silicon oxynitride, or silicon oxide), for example. Note that the first insulating layer 204 may be formed to have either a single-layer structure or a layered structure including a plurality of layers. A layered structure including two layers in which a silicon oxynitride layer is stacked over a silicon nitride layer is employed here, for example. Note that the first insulating layer 204 forms at least a gate insulating layer.

Note that "silicon nitride oxide" contains more nitrogen than oxygen and, and it preferably contains oxygen, nitrogen, silicon, and hydrogen at concentrations ranging from 5 at. % to 30 at. %, 20 at. % to 55 at. %, 25 at. % to 35 at. %, and 10 at. % to 30 at. %, respectively in the case where measurements are performed using Rutherford backscattering spectrometry (RBS) and hydrogen forward scattering spectrometry (HFS).

In contrast, "silicon oxynitride" contains more oxygen than nitrogen and it preferably contains oxygen, nitrogen, silicon, and hydrogen at concentrations ranging from 50 at. % to 70 at. %, 0.5 at. % to 15 at. %, 25 at. % to 35 at. %, and 0.1 at. % to 10 at. %, respectively in the case where measurements are performed using RBS and HFS. Note that percentages of nitrogen, oxygen, silicon, and hydrogen fall within the ranges given above, where the total number of atoms contained in the silicon oxynitride or the silicon nitride oxide is defined as 100 at. %.

Note that in the case where an uppermost layer of the first insulating layer 204 is a silicon nitride layer or a silicon nitride oxide layer, the surface of the insulating layer 204 is preferably exposed to plasma generated by a $N_2O$ gas. This is because the surface of the first insulating layer 204 can be oxidized and crystallinity of a first semiconductor film 206 formed over the first insulating layer 204 can be improved by exposing the surface of the insulating layer 204 to plasma generated by a $N_2O$ gas. However, the gas generating plasma is not limited to the $N_2O$ gas, and may be a gas which can oxidize the surface of the first insulating layer 204 (an oxidizing gas or a gas including oxygen).

Figure 3B:
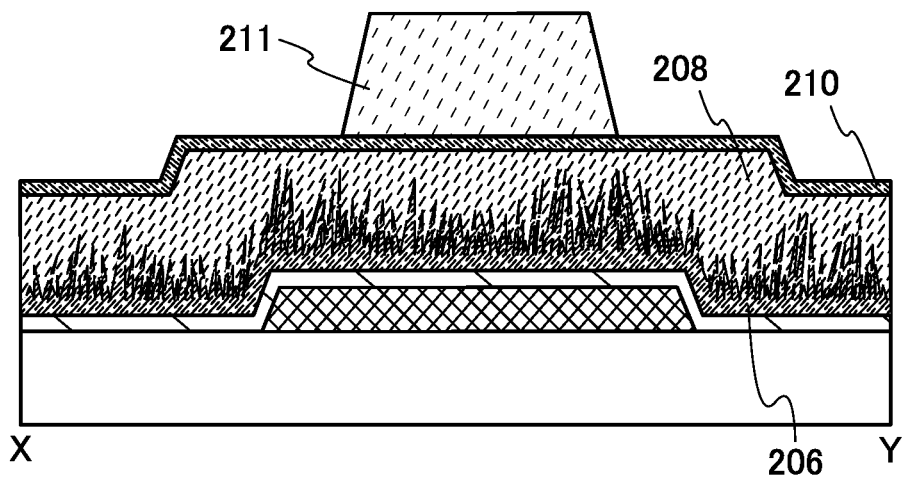

Next, the first semiconductor film 206, a second semiconductor film 208, and an impurity semiconductor film 210 are stacked in this order over the first insulating layer 204, and an etching mask 211 is formed over the impurity semiconductor film 210 (FIG. 3B).

The first semiconductor film 206 is preferably formed of a semiconductor material having high carrier mobility, preferably formed of a crystalline semiconductor. As the crystalline semiconductor, a microcrystalline semiconductor can be given, for example. Here, a microcrystalline semiconductor is a semiconductor having an intermediate structure between amorphous and crystalline structures (including a single crystal structure and a polycrystalline structure). A microcrystalline semiconductor is a semiconductor having a third state that is stable in terms of free energy and a crystalline semiconductor having short-range order and lattice distortion, in which columnar or needle-like crystal grains having a crystal grain size of 2 nm to 200 nm, preferably 10 nm to 80 nm, more preferably 20 nm to 50 nm have grown in a direction normal to the substrate surface. Thus, there is a case where crystal grain boundaries are formed at the interface of the columnar or needle-like crystal grains. Note that the crystal grain size here means a maximum diameter of a crystal grain in a plane parallel to the substrate surface. Further, the crystal grain includes an amorphous semiconductor region and a crystallite which is a minute crystal that can be regarded as a single crystal. The crystal grain may include a twin crystal.

Note that microcrystalline silicon is used as the microcrystalline semiconductor. Microcrystalline silicon, which is one of microcrystalline semiconductors, has a peak of Raman spectrum which is shifted to a lower wave number side than 520 $cm^{-1}$ that represents single crystal silicon. That is, the peak of the Raman spectrum of microcrystalline silicon is within the range of from 520 $cm^{-1}$ which represents single crystal silicon, to 480 $cm^{-1}$ which represents amorphous silicon. The microcrystalline silicon includes hydrogen or halogen of at least 1 at. % to terminate a dangling bond. Moreover, microcrystalline silicon contains a rare gas element such as He, Ar, Kr, or Ne to further promote lattice distortion, so that stability is increased and a favorable microcrystalline semiconductor can be obtained.

Note that the concentration of oxygen and nitrogen contained in the crystalline semiconductor film (measured by secondary ion mass spectrometry) is reduced, preferably less than $1 \times 10^{18}$ $cm^{-3}$, and the crystallinity can be increased.

Note that the crystalline semiconductor film is preferably formed by a two-step deposition treatment. In the two-step deposition treatment, for example, a microcrystalline silicon film with a thickness of approximately 5 nm may be formed under a pressure of approximately 500 Pa in the first step, and a microcrystalline silicon film with a desired thickness may be formed under a pressure of approximately 5000 Pa in the second step. In the second step, a flow ratio of silane may be set smaller than that in the first step so that silane is used at high dilution.

The second semiconductor film 208 is preferably formed of a semiconductor material having low carrier mobility than the first semiconductor layer 206 in order to serve as a buffer layer, and preferably includes an amorphous semiconductor and a minute semiconductor crystal grain. In addition, the second semiconductor film 208 has lower energy at the Urbach edge, which is measured by a constant photocurrent (CPM) method or photoluminescence spectrometry, and a smaller quantity of absorption spectra of defects, as compared to a conventional amorphous semiconductor film. That is, as compared to the conventional amorphous semiconductor film, such a semiconductor film is a well-ordered semiconductor film which has few defects and a steep tail slope of a level at a band edge (a mobility edge) in the valence band.

The second semiconductor film 208 may contain halogen or nitrogen. In the case of containing nitrogen, nitrogen may exist as an NH group or an $NH_2$ group.

An interface region between the first semiconductor film 206 and the second semiconductor film 208 includes microcrystalline semiconductor regions and an amorphous semiconductor region which is between the microcrystalline semiconductor regions. Specifically, the interface region between the first semiconductor film 206 and the second semiconductor film 208 includes microcrystalline semiconductor regions which extend in conical or pyramidal shapes from the first semiconductor film 206 and a "film containing an amorphous semiconductor" which is similar to the second semiconductor film 208.

The buffer layer is provided with the use of the second semiconductor film 208; thus, off-state current of a transistor can be reduced. Further, since the interface region has the conical or pyramidal microcrystalline semiconductor regions, resistance in the vertical direction (the film thickness direction), that is, resistance between the second semiconductor film 208 and a source region or a drain region formed of the impurity semiconductor film 210, can be lowered. Thus, the on-state current of the transistor can be increased. That is to say, as compared to the case of using a conventional amorphous semiconductor, the off-state current can be sufficiently reduced and a reduction in on-state current can be suppressed; thus, switching characteristics of the transistor can be improved.

Note that, as the first semiconductor layer formed using the first semiconductor film 206 becomes thinner in the completed transistor, the on-state current is decreased. As the first semiconductor layer formed using the first semiconductor film 206 becomes thicker in the completed transistor, a contact area between the first semiconductor layer formed using the first semiconductor film 206 and the second conductive layer is increased and the off-state current is increased. Therefore, to increase the on/off ratio, it is preferable to form the first semiconductor film 206 to have a large thickness and further to perform insulation treatment on side surfaces of a thin film layered body 212 including the first semiconductor layer formed using the first semiconductor film 206.

A large portion of the above microcrystalline semiconductor region preferably includes a crystal grain having a conical or pyramidal shape whose top gets narrower from the first semiconductor film 206 toward the second semiconductor film 208. Alternatively, the large portion of the above microcrystalline semiconductor region may include a crystal grain having a conical or pyramidal shape whose top gets wider from the first semiconductor film 206 toward the second semiconductor film 208.

When the microcrystalline semiconductor region includes a crystal grain having a conical or pyramidal shape whose top gets narrower from the first semiconductor film 206 toward the second semiconductor film 208 in the above interface region, the proportion of the microcrystalline semiconductor region on the first semiconductor film 206 side is higher than that on the second semiconductor film 208 side. The microcrystalline semiconductor region grows from a surface of the first semiconductor film 206 in the film thickness direction. When the flow rate of hydrogen with respect to that of a deposition gas (e.g., silane) in a source gas is low (that is, the dilution ratio is low) or the concentration of a source gas containing nitrogen is high, crystal growth of the microcrystalline semiconductor region is suppressed, and thus, a crystal grain comes to have a conical or pyramidal shape, and a large portion of the deposited semiconductor is amorphous.

The above interface region preferably contains nitrogen, in particular, an NH group or an $NH_2$ group. This is because defects are reduced and carriers flow easily when nitrogen, in particular, an NH group or an $NH_2$ group is bonded with dangling bonds of silicon atoms at an interface of crystal included in the microcrystalline semiconductor region or at an interface between the microcrystalline semiconductor region and the amorphous semiconductor region. Accordingly, by setting the concentration of nitrogen, preferably, an NH group or an $NH_2$ group to $1\times10^{20}$ cm$^{-3}$ to $1\times10^{21}$ cm$^{-3}$, the dangling bonds of silicon atoms can be easily cross-linked with nitrogen, preferably an NH group or an $NH_2$ group, so that carriers can flow easily. As a result, a bond which promotes the carrier transfer is formed at a crystal grain boundary or a defect, whereby the carrier mobility of the interface region is further increased. Therefore, the field effect mobility of the transistor is improved.

Further, when the concentration of oxygen in the interface region is reduced, the defect density at the interface between the microcrystalline semiconductor region and the amorphous semiconductor region or the interface between crystal grains can be reduced, so that bonds which inhibit carrier transfer can be reduced.

The impurity semiconductor film 210 is formed using a semiconductor to which an impurity element imparting one conductivity type is added. In the case where the transistor is an n-type transistor, for example, it is possible to use silicon to which P or As is added as the semiconductor to which an impurity element imparting one conductivity type is added. In the case where the transistor is a p-type transistor, boron (B) can be added as an impurity element imparting one conductivity type, for example. However, the n-type transistor is preferably used. Therefore, as an example, silicon to which P is added is used here. The impurity semiconductor film 210 may be formed of an amorphous semiconductor or a crystalline semiconductor such as a microcrystalline semiconductor.

Note that it is preferable that formation of the first insulating layer 204, the first semiconductor film 206, the second semiconductor film 208, and the impurity semiconductor film 210 be performed in the same chamber in succession. This is to prevent impurities from entering interfaces between components from the first insulating layer 204 to the impurity semiconductor film 210.

The etching mask 211 may be formed of a resist material.

Figure 3C:
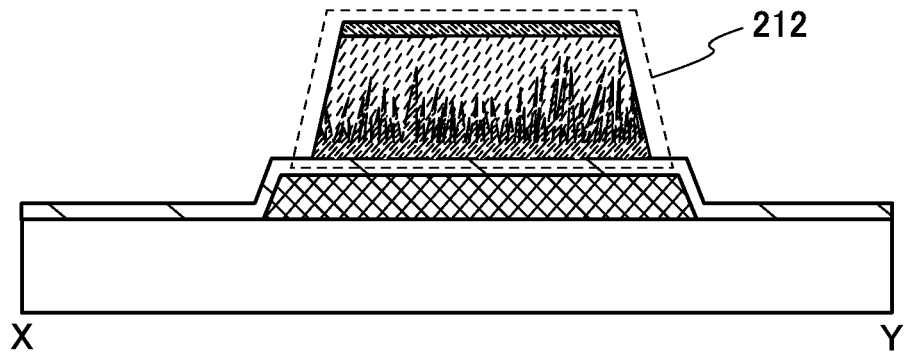

Next, using the etching mask 211, the first semiconductor film 206, the second semiconductor film 208, and the impurity semiconductor film 210 are etched, so that the thin film layered body 212 is formed (FIG. 3C).

Note that it is preferable to perform insulation treatment on the side surfaces of the thin film layered body 212. That is because the off-state current often increases when the first semiconductor layer and the second conductive layer of the completed transistor are in contact with each other. Here, for the insulation treatment, the side surfaces of the thin film layered body 212 can be exposed to oxygen plasma or nitrogen plasma. Alternatively, the insulation treatment may be performed as follows: an insulating film is formed while the side surfaces of the thin film layered body 212 are exposed, and the insulating film is etched in the direction perpendicular to a surface of the substrate 200 by an etching method with high anisotropy, so that side wall insulating layers are formed in contact with the side surfaces of the thin film layered body 212.

Figure 4A:
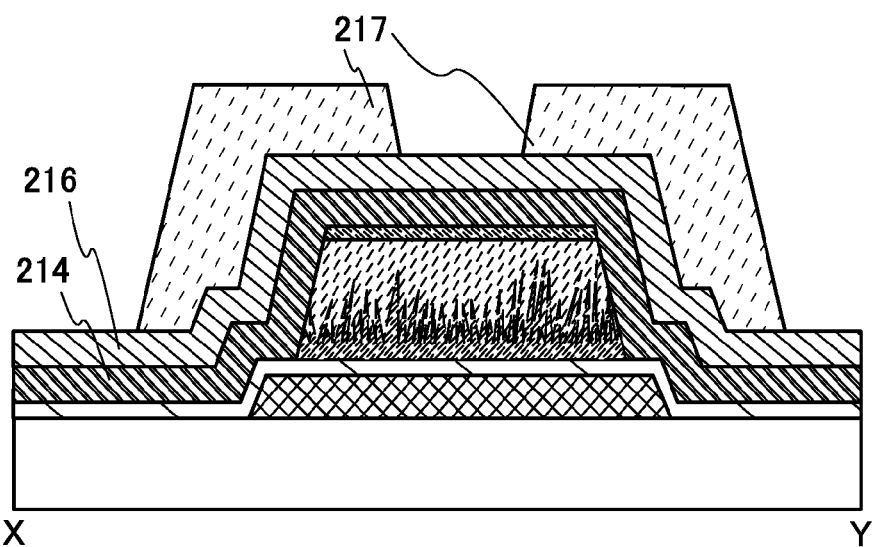
FIGS. 4A to 4C illustrate a method for manufacturing a semiconductor device that is one embodiment of the present invention.

Next, a conductive film 214 and an insulating film 216 are formed over the first insulating layer 204 and the thin film layered body 212, and an etching mask 217 is formed on the insulating film 216 (FIG. 4A).

The conductive film 214 may be formed using a conductive material (e.g., metal or a semiconductor to which an impurity element imparting one conductivity type is added) in a manner similar to that for the first conductive layer 202. Note that the conductive film 214 may have a single-layer structure or a layered structure including a plurality of layers. A layered structure of three layers in which an Al layer is interposed between Ti layers is employed here, for example.

The insulating film 216 may be formed using a material and a method which are similar to those for the first insulating layer 204. In addition, the insulating film 216 may have a single-layer structure or a layered structure including a plurality of layers. Here, the insulating film 216 may be formed of silicon nitride, for example.

The etching mask 217 may be formed of a resist material.

Figure 4B:
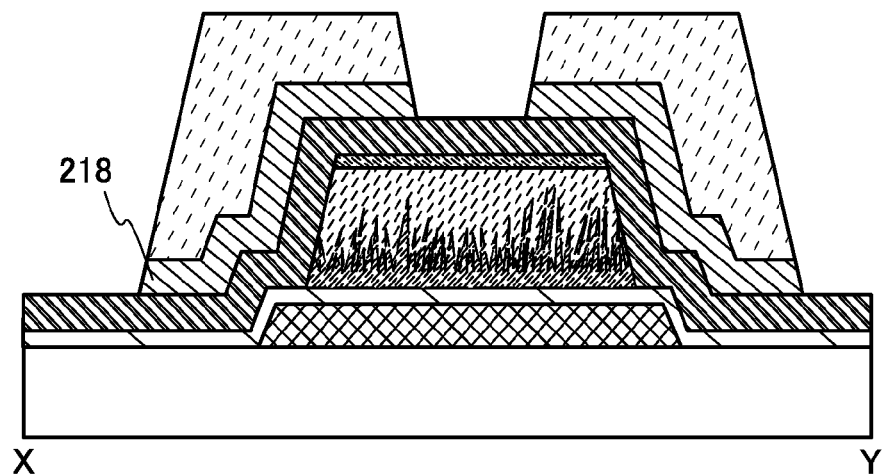

Then, the insulating film 216 is etched using the etching mask 217, whereby a second insulating layer 218 is formed (FIG. 4B).

Figure 4C:
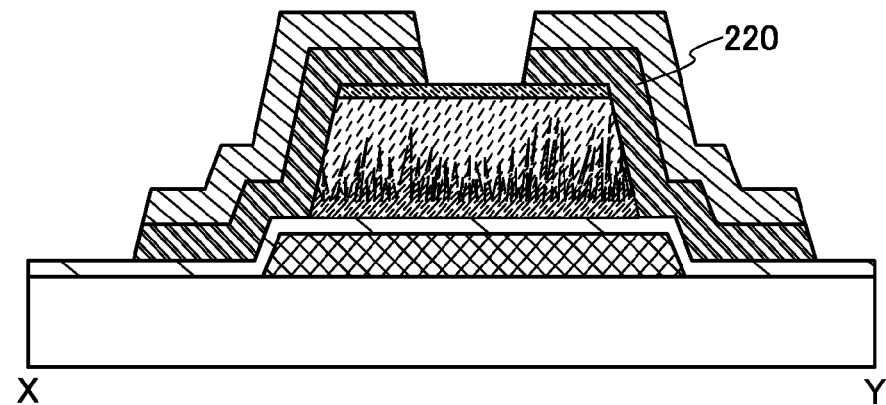

Subsequently, the conductive film 214 is etched, whereby a second conductive layer 220 is formed (FIG. 4C).

Note that a step of etching the insulating film 216 (a step in which the insulating film 216 in the state shown in FIG. 4A is processed to be in the state shown in FIG. 4B) and a step of etching the conductive film 214 (a step in which the insulating film 216 in the state shown in FIG. 4B is processed to be in the state shown in FIG. 4C) are preferably performed collectively in the same etching step for simplification of a manufacturing process.

Note that the conductive film 214 may be etched using the second insulating layer 218 as an etching mask. At that time, before etching the conductive film 214 to form the second conductive layer 220, the etching mask 217 may be removed.

Note that when the conductive film 214 is etched to form the second conductive layer 220, an upper portion of the thin film layered body 212 may be etched.

Figure 5A:
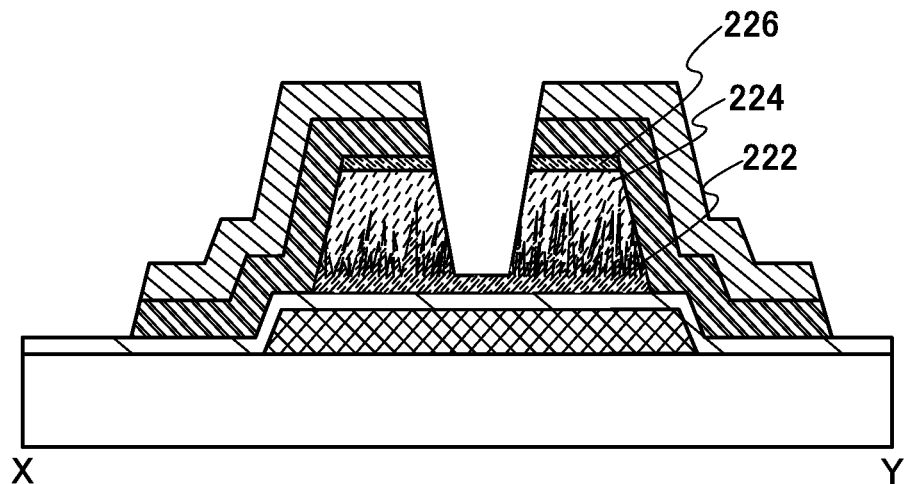
FIGS. 5A to 5C illustrate a method for manufacturing a semiconductor device that is one embodiment of the present invention.

Next, the upper portion of the thin film layered body 212 is etched, so that a first semiconductor layer 222, second semiconductor layers 224, and an impurity semiconductor layer 226 are formed (FIG. 5A). The etching of the thin film layered body 212 may be performed by a single etching step or a plurality of etching steps. The etching is performed until a portion of the first semiconductor layer 222 (that is, a portion to be a channel formation region), which does not overlap with the second semiconductor layers 224, is finally exposed.

The step of etching the conductive film 214 to form the second conductive layer 220 and the step of etching the upper portion of the thin film layered body 212 to form the first semiconductor layer 222, the second semiconductor layers 224, and the impurity semiconductor layer 226 may be performed at the same time as one step.

Figure 5B:
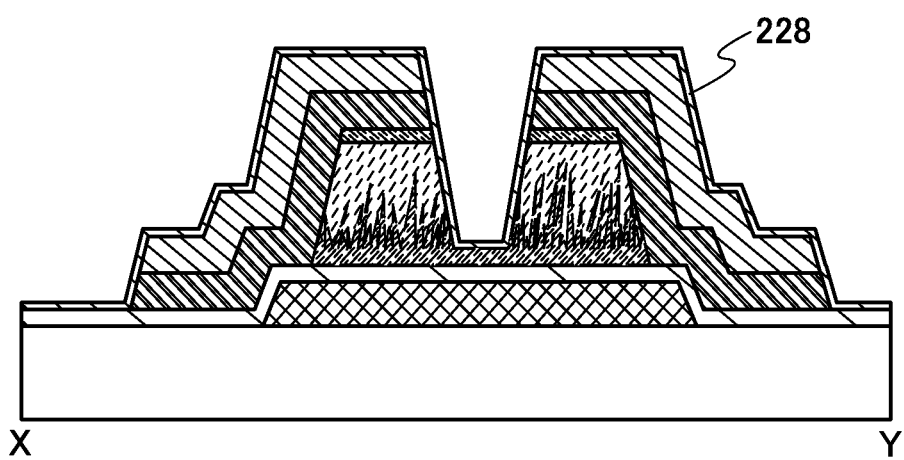

Next, a third insulating layer 228 is formed (FIG. 5B).

The third insulating layer 228 may be formed of an insulating material as in the cases of the first insulating layer 204 and the insulating film 216. The third insulating layer 228 may have a single-layer structure or a layered structure including a plurality of layers. Here, the third insulating layer 228 may be formed of silicon nitride, for example.

Figure 5C:
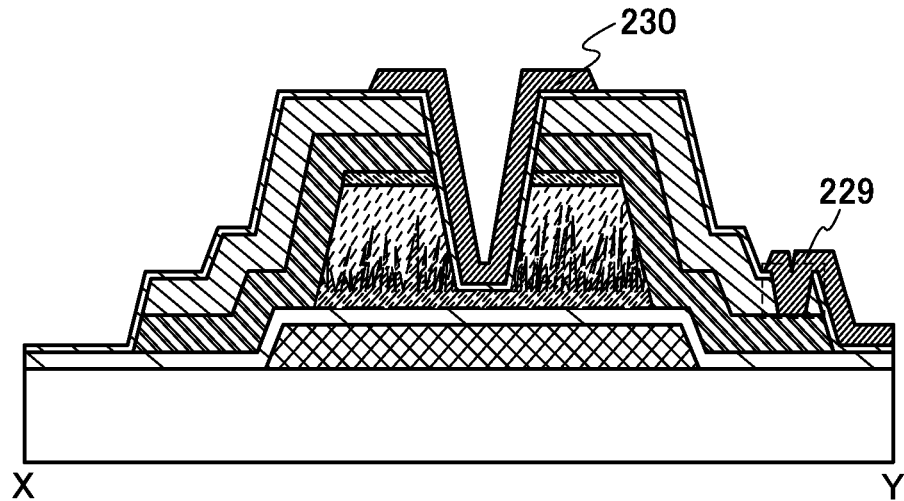

Next, an opening portion 229 is formed in the second insulating layer 218 and the third insulating layer 228, and a third conductive layer 230 is formed so as to be connected to the second conductive layer 220 in the opening portion 229 (FIG. 5C).

The third conductive layer 230 can be formed using a conductive composition containing a conductive high molecule (also referred to as a conductive polymer) having a light-transmitting property. It is preferable that the third conductive layer 230 formed using the conductive composition have a sheet resistance of 10000 Ω/square or less and a light transmittance of 70% or more at a wavelength of 550 nm. Further, the resistivity of the conductive high molecule included in the conductive composition is preferably less than or equal to 0.1 Ω·cm.

As the conductive high molecule, a "π-electron conjugated conductive high-molecule" can be used. Examples of the π-electron conjugated conductive high-molecule are polyaniline or a derivative thereof, polypyrrole or a derivative thereof, polythiophene or a derivative thereof, a copolymer of two or more kinds of aniline, pyrrole, and thiophene, and the like.

The third conductive layer 230 can be formed of, for example, indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, indium tin oxide to which silicon oxide is added, or the like.

The third conductive layer 230 may be formed by processing a film that is formed of the above-described material by a photolithography method.

By forming the third conductive layer 230 using a material having a light-transmitting property, the third conductive layer 230 can serve as a pixel electrode.

Not shown in the drawing, it is preferable that a fourth insulating layer be provided between the third insulating layer 228 and the third conductive layer 230, and the fourth insulating layer overlaps with part of the second conductive layer. The fourth insulating layer is preferably formed by a method which makes a surface substantially flat. This is because when the surface of the fourth insulating layer is substantially flat, disconnection or the like of a pixel electrode layer formed over the fourth insulating layer can be prevented. Therefore, the phrase "substantially flat" here may be at the level which can achieve the above-described purpose, and high flatness is not required.

The fourth insulating layer can be formed, for example, by a spin coating method or the like using photosensitive polyimide, acrylic, epoxy resin, or the like. Note that the material and the formation method of the fourth insulating layer are not limited to the above-described materials and formation method.

As described above, the semiconductor device of Embodiment 1 can be manufactured by a simple process.

The substrate 200 corresponds to the substrate 100 in Embodiment 1.

The first electrode 202 corresponds to the first conductive layer 102 in Embodiment 1.

The first insulating layer 204 corresponds to the first insulating layer 104 in Embodiment 1.

The first semiconductor layer 222 corresponds to the first semiconductor layer 106 in Embodiment 1.

The second semiconductor layers 224 correspond to the second semiconductor layers 108 in Embodiment 1.

The impurity region 226 corresponds to the first impurity semiconductor layer 110 in Embodiment 1.

Further, the second conductive layer 220 corresponds to the second conductive layer 112 in Embodiment 1.

The second insulating layer 218 corresponds to the second insulating layer 114 in Embodiment 1.

The third insulating layer 228 corresponds to the third insulating layer 116 in Embodiment 1.

The third conductive layer 230 corresponds to the third conductive layer 118 in Embodiment 1.

The third opening portion 229 corresponds to the opening portion 120 in Embodiment 1.

Note that the second conductive layer 112 is connected to the third conductive layer 118 in the opening portion 120 in Embodiment 1. Further, the first conductive layer 102 is connected to the third conductive layer 118 in the opening portion 122. Here, in Embodiment 2, formation methods of the opening portion 229 and an opening portion 231 corresponding to the opening portion 120 and the opening portion 122, respectively are described.

The opening portion 229 and the opening portion 231 may be formed by a single etching step or a plurality of etching steps.

FIGS. 6A1, 6A2, 6B1, 6B2, 6C1, and 6C2 illustrate the formation method of the opening portion 229, and FIGS. 6A2, 6A2, 6B1, 6B2, 6C1, and 6C2 illustrate the formation method of the opening portion 231.

First, an etching mask 240 is formed over a portion other than the portions where the opening portion 229 and the opening portion 231 are to be formed (FIGS. 6A1 and 6A2).

In the portion where the opening portion 229 is to be formed, the first insulating layer 204, the second conductive layer 220, the second insulating layer 218, and the third insulating layer 228 are provided over the substrate 200. On the other hand, in the portion where the opening portion 231 is to be formed, the first conductive layer 202, the first insulating layer 204, and the third insulating layer 228 are provided over the substrate 200.

Next, the opening portion 231 is formed by etching the first insulating layer 204 and the third insulating layer 228 with the use of the etching mask 240 at the same time as the formation of the opening portion 229 by etching the second insulating layer 218 and the third insulating layer 228 with the use of the etching mask 240 (FIGS. 6B1 and 6B2).

Next, the third conductive layer 230 is selectively formed in each of the opening portion 229 and the opening portion 231 (FIGS. 6C1 and 6C2).

Alternatively, as illustrated in FIGS. 7A1, 7A2, 7B1, 7B2, 7C1, 7C2, 7D1, and 7D2, the opening portion 229 and the opening portion 231 may be formed by a two-step etching process.

FIGS. 7A1, 7B1, 7C1, and 7D1 illustrate a formation method of the opening portion 229 by the two-step etching process, and FIGS. 7A2, 7B2, 7C2, and 7D2 illustrate a formation method of the opening portion 231 by the two-step etching process.

First, the etching mask 240 is formed over a portion other than the portions where the opening portion 229 and the opening portion 231 are to be formed (FIGS. 7A1 and 7A2). As in the case of FIGS. 6A1, 6A2, 6B1, 6B2, 6C1, and 6C2, in the portion where the opening portion 229 is to be formed, the first insulating layer 204, the second conductive layer 220, the second insulating layer 218, and the third insulating layer 228 are formed. On the other hand, in the portion where the opening portion 231 is to be formed, the first conductive layer 202, the first insulating layer 204, and the third insulating layer 228 are formed over the substrate 200.

Next, the third insulating layer 228 is etched using the etching mask 240, whereby an opening portion 229P and an opening portion 231P are formed (FIGS. 7B1 and 7B2).

Next, the opening portion 231 is formed by etching the first insulating layer 204 in a portion of the opening portion 231P at the same time as the formation of the opening portion 229 by etching the second insulating layer 218 in a portion of the opening portion 229P (FIGS. 7C1 and 7C2).

Subsequently, the third conductive layer 230 is selectively formed in each of the opening portion 229 and the opening portion 231 (FIGS. 7D1 and 7D2).

As described above, the opening portion 229 and the opening portion 231 can be formed.

Embodiment 3

As a semiconductor device in which a thin film transistor manufactured according to any of the above embodiments is used, an electronic paper can be given. An electronic paper can be used for electronic appliances of a variety of fields as long as they can display data. For example, electronic paper can be applied to an electronic book reader (e-book), a poster, a digital signage, a public information display (PID), an advertisement in a vehicle such as a train, displays of various cards such as a credit card, and the like. An example of the electronic appliance is illustrated in FIG. 8.

Figure 8:
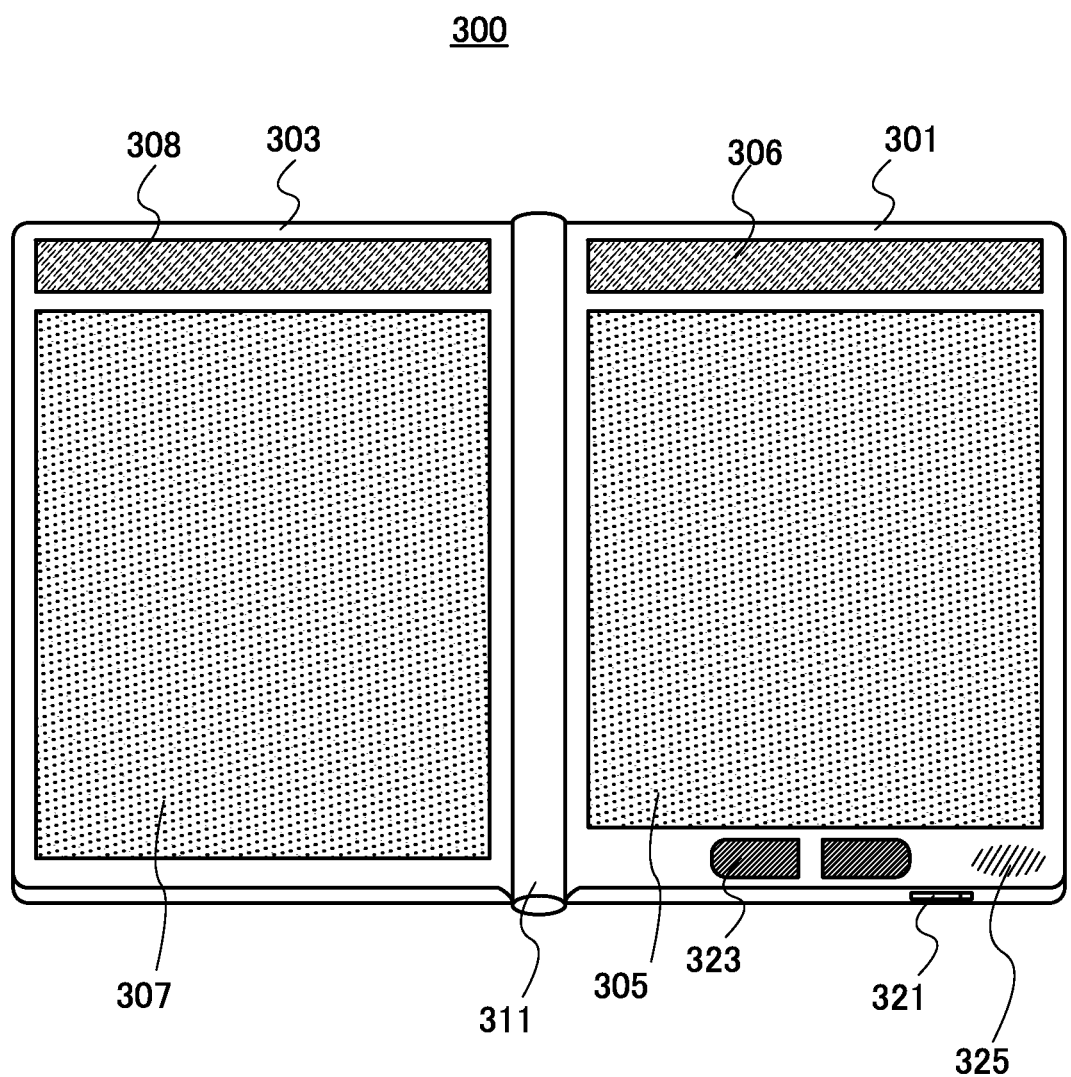
FIG. 8 illustrates a semiconductor device that is one embodiment of the present invention.

FIG. 8 illustrates an example of an e-book reader. For example, the e-book reader 300 includes two housings, a housing 301 and a housing 303. The housing 301 and the housing 303 are combined with a hinge 311 so that the e-book reader 300 can be opened and closed with the hinge 311 as an axis. With such a structure, the e-book reader 300 can be handled like a paper book.

A display portion 305 and a photoelectric conversion device 306 are incorporated in the housing 301. A display portion 307 and a photoelectric conversion device 308 are incorporated in the housing 303. The display portions 305 and 307 may display one image or different images. In the case where the display portion 305 and the display portion 307 display different images, for example, a display portion on the right side (the display portion 305 in FIG. 8) can display text and a display portion on the left side (the display portion 307 in FIG. 8) can display graphics.

Further, in FIG. 8, the housing 301 is provided with an operation portion and the like. For example, the housing 301 is provided with a power switch 321, operation keys 323, a speaker 325, and the like. The page can be turned with the operation key 323. Note that a keyboard, a pointing device, or the like may also be provided on the surface of the housing, on which the display portion is provided. Furthermore, an external connection terminal (an earphone terminal, a USB terminal, a terminal that can be connected to an AC adapter or a variety of cables such as a USB cable, or the like), a recording medium insertion portion, and the like may be provided on the back surface or the side surface of the housing. Moreover, the e-book reader 300 may have a function of an electronic dictionary.

The e-book reader 300 may be configured to transmit and receive data wirelessly. Through wireless communication, desired book data or the like can be purchased and downloaded from an electronic book server.

Embodiment 4

As a semiconductor device in which a thin film transistor manufactured according to any of the above embodiments is used, a variety of electronic appliances (including an amusement machine) can be given in addition to electronic paper. Examples of electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game console, a portable information terminal, an audio reproducing device, a large-sized game machine such as a pachinko machine, and the like.

Figure 9A:
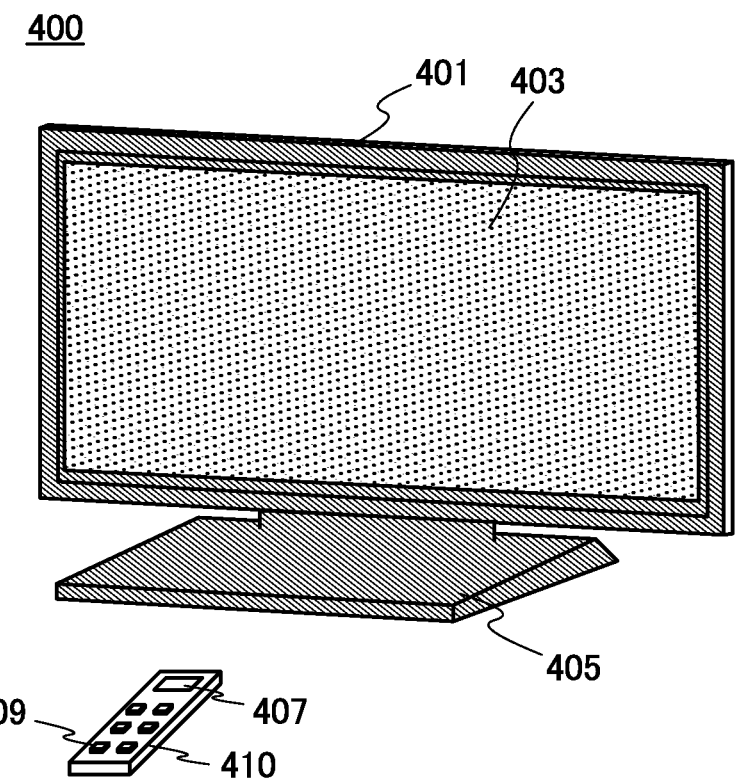
FIGS. 9A and 9B each illustrate a semiconductor device that is one embodiment of the present invention.

FIG. 9A illustrates an example of a television set. A display portion 403 is incorporated in a housing 401 of a television set 400. Images can be displayed on the display portion 403. Here, the housing 401 is supported by a stand 405.

The television set 400 can be operated by an operation switch of the housing 401 or a separate remote controller 410. Channels can be switched and volume can be controlled with operation keys 409 of the remote controller 410, whereby an image displayed on the display portion 403 can be controlled. Moreover, the remote controller 410 may have a display portion 407 in which the information outgoing from the remote controller 410 is displayed.

Note that the television set 400 is provided with a receiver, a modem, and the like. With the use of the receiver, general television broadcasting can be received. Furthermore, when the display device is connected to a communication network with or without wires via the modem, one-way (from a sender to a receiver) or two-way (between a sender and a receiver or between receivers) information communication can be performed.

Figure 9B:
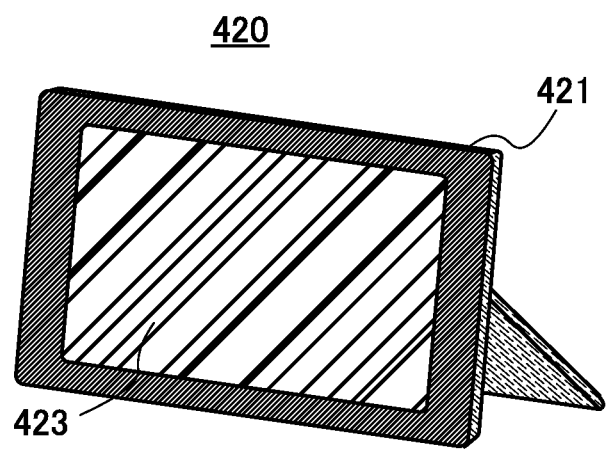

FIG. 9B illustrates an example of a digital photo frame. For example, a display portion 423 is incorporated in a housing 421 of the digital photo frame 420. The display portion 423 can display various images. For example, the display portion 423 can display data of an image shot by a digital camera or the like to function as a normal photo frame.

Note that the digital photo frame 420 is provided with an operation portion, an external connection portion (a USB terminal, a terminal that can be connected to various cables such as a USB cable, or the like), a recording medium insertion portion, and the like. Although these components may be provided on the surface on which the display portion is provided, it is preferable to provide them on the side surface or the back surface for the design of the digital photo frame. For example, a memory storing an image data taken with a digital camera is inserted in the recording medium insertion portion of the digital photo frame and the image data is loaded, whereby the image data can be displayed on the display portion 423.

The digital photo frame 420 may have a configuration capable of wirelessly transmitting and receiving data. The structure may be employed in which desired image data is transferred wirelessly to be displayed.

Figure 10:
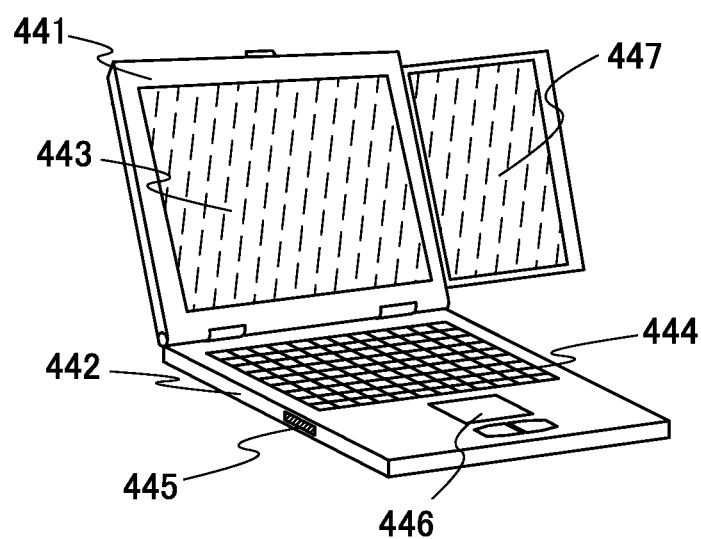
FIG. 10 illustrates a semiconductor device that is one embodiment of the present invention.

FIG. 10 is a perspective view illustrating an example of a portable computer.

In the portable computer of FIG. 10, a top housing 441 having a display portion 443 and a bottom housing 442 having a keyboard 444 can overlap with each other by closing a hinge unit which connects the top housing 441 and the bottom housing 442. The portable computer is convenient for carrying around. Moreover, in the case of using the keyboard for input, the hinge unit is opened so that a user can input looking at the display portion 443.

The bottom housing 442 includes a pointing device 446 with which input can be performed, in addition to the keyboard 444. Further, when the display portion 443 is a touch input panel, input can be performed by touching part of the display portion. The bottom housing 442 includes an arithmetic function portion such as a CPU or hard disk. In addition, the bottom housing 442 includes an external connection port 445 into which another device such as a communication cable conformable to communication standards of a USB is inserted.

The top housing 441, which includes a display portion 447 and can keep the display portion 447 therein by sliding it toward the inside of the top housing 441, can have a large display screen. In addition, the user can adjust the orientation of a screen of the storable display portion 447. When the storable display portion 447 is a touch input panel, input can be performed by touching part of the storable display portion.

The display portion 443 or the storable display portion 447 is formed using an image display device such as a liquid crystal display panel or a light-emitting display panel including an organic light-emitting element, an inorganic light-emitting element, or the like.

In addition, the portable computer illustrated in FIG. 10 can be provided with a receiver and the like and can receive a TV broadcast to display an image on the display portion. While the hinge unit which connects the top housing 441 and the bottom housing 442 is kept closed, the whole screen of the display portion 447 is exposed by sliding the display portion 447 out and the angle of the screen is adjusted; thus, the user can watch a television broadcast. In this case, the hinge unit is not opened and display is not performed on the display portion 443. In addition, start up of only a circuit for displaying television broadcast is performed. Therefore, power can be consumed to the minimum, which is useful for the portable computer whose battery capacity is limited.

Example 1

In this example, a semiconductor device that is one embodiment of the present invention, described in Embodiment 1, was manufactured and electrical characteristics were measured. There are two kinds of samples which were manufactured. One is a sample of Example 1, which is a semiconductor device that is one embodiment of the present invention. The other is a sample of a comparative example, to which the manufacturing method of a semiconductor device that is one embodiment of the present invention was not applied. Note that thin film transistors of Example 1 and the comparative example were each formed to have a channel length of 3.5 μm and a channel width of 20 μm.

First, a method for manufacturing the sample of Example 1 is described.

First, a SiON film with a thickness of 200 nm was formed as a base layer over a substrate by a plasma CVD method. Then, a conductive film to be a first conductive layer was formed over the base layer by a sputtering method and then the conductive film was processed, whereby the first conductive layer was formed. The first conductive layer had a structure in which a 50-nm-thick Ti layer, a 100-nm-thick Al layer, and a 50-nm-thick Ti layer were stacked.

Next, a first insulating layer formed of 300-nm-thick silicon nitride was formed to cover the first conductive layer by a plasma CVD method. Here, detailed conditions for a plasma CVD method were as follows.
Flow rate of monosilane ($SiH_4$) gas: 15 sccm
Flow rate of ammonia ($NH_3$) gas: 500 sccm
Flow rate of nitrogen ($N_2$) gas: 180 sccm
Flow rate of hydrogen ($H_2$) gas: 200 sccm
Pressure in reaction chamber: 100 Pa
Distance between upper electrode and lower electrode: 26 mm
Frequency of high-frequency power source: 13.56 MHz
High-frequency power: 200 W
Temperature of upper electrode: 200° C.
Temperature of lower electrode: 300° C.

Next, a surface of the first insulating layer was subjected to plasma treatment. Here, detailed conditions for the plasma treatment were as follows.
Flow rate of dinitrogen monoxide ($N_2O$) gas: 400 sccm
Pressure in reaction chamber: 60 Pa
Distance between upper electrode and lower electrode: 30 mm
Frequency of high-frequency power source: 13.56 MHz
High-frequency power: 300 W
Temperature of upper electrode: 200° C.
Temperature of lower electrode: 300° C.
Treatment time: 3 minutes Next, a first semiconductor film was formed by a plasma CVD method over the first insulating layer which was subjected to the plasma treatment. Note that in this example, the first semiconductor film was formed by a two-step formation process. That is, a 5-nm-thick microcrystalline silicon film was formed in the first step, and a 65-nm-thick microcrystalline silicon film was formed in the second step. Here, detailed conditions for a plasma CVD method were as follows.

<First Step>
Flow rate of monosilane ($SiH_4$) gas: 2.5 sccm
Flow rate of argon (Ar) gas: 750 sccm
Flow rate of hydrogen ($H_2$) gas: 750 sccm
Pressure in reaction chamber: 1250 Pa
Distance between upper electrode and lower electrode: 7 mm
Frequency of high-frequency power source: 13.56 MHz
High-frequency power: 300 W
Temperature of upper electrode: 200° C.
Temperature of lower electrode: 300° C.

<Second Step>
Flow rate of monosilane ($SiH_4$) gas: 1.5 sccm
Flow rate of argon (Ar) gas: 750 sccm
Flow rate of hydrogen ($H_2$) gas: 750 sccm
Pressure in reaction chamber: 10000 Pa
Distance between upper electrode and lower electrode: 7 mm
Frequency of high-frequency power source: 13.56 MHz
High-frequency power: 300 W
Temperature of upper electrode: 200° C.
Temperature of lower electrode: 300° C.

Next, a second semiconductor film with a thickness of 80 nm was formed by a plasma CVD method over the first semiconductor film. Here, detailed conditions for the plasma CVD method were as follows.
Flow rate of monosilane ($SiH_4$) gas: 25 sccm
Flow rate of ammonia gas diluted with hydrogen: 100 sccm
Flow rate of argon (Ar) gas: 750 sccm
Flow rate of hydrogen ($H_2$) gas: 650 sccm
Pressure in reaction chamber: 1250 Pa
Distance between upper electrode and lower electrode: 15 mm
Frequency of high-frequency power source: 13.56 MHz
High-frequency power: 150 W
Temperature of upper electrode: 200° C.
Temperature of lower electrode: 300° C.

Note that the ammonia gas diluted with hydrogen is a gas in which an ammonia gas was diluted with a hydrogen gas to 1000 ppm by volume.

Then, an impurity semiconductor film with a thickness of 50 nm was formed over the second semiconductor film by a plasma CVD method. Here, detailed conditions for the plasma CVD method were as follows.
Flow rate of monosilane ($SiH_4$) gas: 90 sccm
Flow rate of phosphine gas diluted with hydrogen: 10 sccm
Flow rate of hydrogen ($H_2$) gas: 500 sccm
Pressure in reaction chamber: 170 Pa
Distance between upper electrode and lower electrode: 25 mm
Frequency of high-frequency power source: 13.56 MHz
High-frequency power: 30 W
Temperature of upper electrode: 200° C.
Temperature of lower electrode: 300° C.

Note that the phosphine gas diluted with hydrogen is a gas in which a phosphine gas was diluted with hydrogen to 0.5 vol. %.

Next, a first etching mask was formed of a resist material over the impurity semiconductor film. Then, the first semiconductor film, the second semiconductor film, and the impurity semiconductor film were etched using the first etching mask, so that a thin film layered body was formed. In this example, the etching was performed by an ICP method. Here, detailed conditions for the etching were as follows.
Flow rate of boron trichloride ($BCl_3$) gas: 36 sccm
Flow rate of carbon tetrafluoride ($CF_4$) gas: 36 sccm
Flow rate of oxygen ($O_2$) gas: 8 sccm
Pressure in reaction chamber: 2.0 Pa
ICP power: 450 W
Bias power between upper electrode and lower electrode: 100 W Next, the thin film layered body was subjected to oxygen plasma treatment. Here, detailed conditions for the oxygen plasma treatment were as follows.
Flow rate of oxygen ($O_2$) gas: 100 sccm
Pressure in reaction chamber: 0.67 Pa
High-frequency power: 2000 W
Bias power between upper electrode and lower electrode: 350 W
Temperature of lower electrode: −10° C.
Treatment time: 30 seconds After that, the first etching mask was removed.
Next, a 300-nm-thick conductive film was formed to cover the thin film layered body by a sputtering method. A second etching mask was formed over the conductive film. The conductive film had a structure in which a 50-nm-thick Ti layer a 200-nm-thick Al layer and a 50-nm-thick Ti layer were stacked.

Next, an insulating film to be a second insulating layer formed of 300-nm-thick silicon nitride was formed by a plasma CVD method to cover the first semiconductor layer, second semiconductor layers, the impurity semiconductor layer, and the second conductive layer. The detailed conditions for the plasma CVD method were as follows.
Flow rate of monosilane ($SiH_4$) gas: 15 sccm
Flow rate of ammonia ($NH_3$) gas: 500 sccm
Flow rate of nitrogen ($N_2$) gas: 180 sccm
Flow rate of hydrogen ($H_2$) gas: 200 sccm
Pressure in reaction chamber: 100 Pa
Distance between upper electrode and lower electrode: 26 mm
Frequency of high-frequency power source: 13.56 MHz
High-frequency power: 200 W
Temperature of upper electrode: 200° C.
Temperature of lower electrode: 300° C.

Next, the insulating film was etched by two steps using the second etching mask. The detailed conditions for the etching were as follows.

<First Step>
Flow rate of trifluoromethane ($CHF_3$) gas: 50 sccm
Flow rate of helium (He) gas: 100 sccm
Pressure in a reaction chamber: 5.5 Pa
ICP power: 475 W
Bias power between upper electrode and lower electrode: 300 W <Second Step>
Flow rate of trifluoromethane ($CHF_3$) gas: 7.5 sccm
Flow rate of helium (He) gas: 142.5 sccm
Pressure in reaction chamber: 5.5 Pa
ICP power: 475 W
Bias power between upper electrode and lower electrode: 300 W Then, ashing was performed in an oxygen ($O_2$) atmosphere; after that, the second etching mask was removed.

Next, etching was performed until the first semiconductor film was exposed. Here, the detailed conditions for the etching were as follows.
Flow rate of carbon tetrafluoride ($CF_4$) gas: 100 sccm
Pressure in reaction chamber: 0.67 Pa
Source power: 1000 W
Bias power between upper electrode and lower electrode: 50 W Next, plasma treatment was performed on the exposed portion of the semiconductor layer formed using the first semiconductor film. Here, the detailed conditions for the plasma treatment were as follows.
Flow rate of water vapor ($H_2O$) gas: 300 sccm
Pressure in a reaction chamber: 66.5 Pa
High-frequency power: 1800 W
Treatment time: 3 minutes Next, an insulating film to be a third insulating layer formed of 300-nm-thick silicon nitride was formed by a plasma CVD method to cover the first semiconductor layer, the second semiconductor layers, the impurity semiconductor layer, the second conductive layer, and the second insulating layer. The detailed conditions for the plasma CVD method were as follows.
Flow rate of monosilane ($SiH_4$) gas: 20 sccm
Flow rate of ammonia ($NH_3$) gas: 220 sccm
Flow rate of nitrogen ($N_2$) gas: 450 sccm
Flow rate of hydrogen ($H_2$) gas: 450 sccm
Pressure in reaction chamber: 160 Pa
Distance between upper electrode and lower electrode: 21 mm
Frequency of high-frequency power source: 13.56 MHz
High-frequency power: 200 W
Temperature of upper electrode: 250° C.
Temperature of lower electrode: 290° C.

Next, an etching mask was formed over the insulating film and the insulating film was etched using the etching mask to form an opening portion, so that a third insulating layer was formed. The opening portion was formed to overlap with a portion of the second conductive layer, which is to be a source electrode or a drain electrode.

Next, a 50-nm-thick conductive film to be a third conductive layer was formed over the third insulating layer by a sputtering method. Here, ITO was used for the conductive film. After that, an etching mask was formed over the conductive film and etching was performed, so that the third conductive layer was formed.

Next, a method for manufacturing the sample of the comparative example is described.

As in the sample of Example 1, a base layer and a conductive film to be a first conductive layer were formed over a substrate, and the conductive film was processed, so that the first conductive layer was formed.

Next, a first insulating layer formed of 300-nm-thick silicon nitride was formed to cover the first conductive layer by a plasma CVD method. The detailed conditions for the plasma CVD were the same as those for the sample of Example 1 except that the distance between the upper electrode and the lower electrode was 30 mm, the temperature of the upper electrode was 250° C., and the temperature of the lower electrode was 290° C.

Subsequently, plasma treatment was performed on a surface of the first insulating layer. Here, the detailed conditions for the plasma treatment were the same as those for the sample of Example 1 except that the temperature of the upper electrode was 250° C., and the temperature of the lower electrode was 290° C.

Next, a first semiconductor film was formed by a plasma CVD method over the first insulating layer which was subjected to the plasma treatment. Note that in this example, the first semiconductor film was formed in a three-step formation process. That is, a 5-nm-thick microcrystalline silicon film was formed in the first step, a 25-nm-thick microcrystalline silicon film was formed in the second step, and a 40-nm-thick microcrystalline silicon film was formed in the third step. Note that the three-step formation process was performed while the flow rate of monosilane was periodically changed. Here, detailed conditions for the plasma CVD method were as follows.

<First Step>
Flow rate of monosilane ($SiH_4$) gas: 3.0 sccm
Flow rate of argon (Ar) gas: 750 sccm
Flow rate of hydrogen ($H_2$) gas: 750 sccm
Pressure in reaction chamber: 1250 Pa
Distance between upper electrode and lower electrode: 15 mm
Frequency of high-frequency power source: 13.56 MHz
High-frequency power: 100 W
Temperature of upper electrode: 250° C.
Temperature of lower electrode: 290° C.

<Second Step>
Flow rate of monosilane ($SiH_4$) gas: 2.0 sccm
Flow rate of argon (Ar) gas: 1500 sccm
Flow rate of hydrogen ($H_2$) gas: 1500 sccm
Pressure in reaction chamber: 10000 Pa
Distance between upper electrode and lower electrode: 7 mm
Frequency of high-frequency power source: 13.56 MHz
High-frequency power: 350 W
Temperature of upper electrode: 250° C.
Temperature of lower electrode: 290° C.

<Third Step>
Flow rate of monosilane ($SiH_4$) gas: 1.0 sccm (10 seconds)
Flow rate of monosilane ($SiH_4$) gas: 0.1 sccm (5 seconds)
Flow rate of argon (Ar) gas: 1500 sccm
Flow rate of hydrogen ($H_2$) gas: 1500 sccm
Pressure in reaction chamber: 10000 Pa
Distance between upper electrode and lower electrode: 7 mm
Frequency of high-frequency power source: 13.56 MHz
High-frequency power: 350 W
Temperature of upper electrode: 250° C.
Temperature of lower electrode: 290° C.

Next, the second semiconductor film with a thickness of 80 nm was formed by a plasma CVD method over the first semiconductor film. Here, detailed conditions for the plasma CVD method were as follows.
Flow rate of monosilane ($SiH_4$) gas: 20 sccm
Flow rate of ammonia gas diluted with hydrogen: 50 sccm
Flow rate of argon (Ar) gas: 750 sccm
Flow rate of hydrogen ($H_2$) gas: 700 sccm
Pressure in reaction chamber: 350 Pa
Distance between upper electrode and lower electrode: 25 mm
Frequency of high-frequency power source: 13.56 MHz
High-frequency power: 60 W
Temperature of upper electrode: 250° C.
Temperature of lower electrode: 290° C.

Note that the ammonia gas diluted with hydrogen is a gas in which an ammonia gas was diluted with hydrogen to 1000 ppm by volume.

Then, an impurity semiconductor film with a thickness of 50 nm was formed over the second semiconductor film by a plasma CVD method. Here, detailed conditions for the plasma CVD method were as follows.
Flow rate of monosilane ($SiH_4$) gas: 80 sccm
Flow rate of phosphine gas diluted with hydrogen: 150 sccm
Flow rate of hydrogen ($H_2$) gas: 750 sccm
Pressure in reaction chamber: 350 Pa
Distance between upper electrode and lower electrode: 15 mm
Frequency of high-frequency power source: 13.56 MHz
High-frequency power: 30 W
Temperature of upper electrode: 250° C.
Temperature of lower electrode: 290° C.

Note that the phosphine gas diluted with hydrogen is a gas in which a phosphine gas was diluted with hydrogen to 0.5 vol. %.

Next, a first etching mask was formed of a resist material over the impurity semiconductor film, and the first semiconductor film, the second semiconductor film, and the impurity semiconductor film were etched using the first resist mask, so that a thin film layered body was formed. In this example, etching is performed by an ICP method. Here, detailed conditions for the etching were as follows.

Flow rate of boron trichloride ($BCl_3$) gas: 36 sccm
Flow rate of carbon tetrafluoride ($CF_4$) gas: 36 sccm
Flow rate of oxygen ($O_2$) gas: 8 sccm
Pressure in reaction chamber: 2.0 Pa
ICP power: 450 W
Bias power between upper electrode and lower electrode: 100 W Next, the thin film layered body was subjected to oxygen plasma treatment. Here, detailed conditions for the oxygen plasma treatment were as follows.

Flow rate of oxygen ($O_2$) gas: 100 sccm
Pressure in reaction chamber: 0.67 Pa
High-frequency power: 2000 W
Bias power between upper electrode and lower electrode: 350 W
Temperature of lower electrode: −10° C.
Treatment time: 30 seconds Then, the first etching mask was removed.

Next, a 300-nm-thick conductive film was formed to cover the thin film layered body by a sputtering method. A second etching mask was formed over the conductive film. The conductive film had a structure in which a 50-nm-thick Ti layer, a 200-nm-thick Al layer, and a 50-nm-thick Ti layer were stacked.

Then, the insulating film and the conductive film were etched using the second etching mask, so that the second conductive layer was formed and an upper portion of the thin film layered body was also etched. The etching was performed such that a semiconductor layer formed using the first semiconductor film is not exposed. The detailed conditions for the etching were as follows.

Flow rate of boron trichloride ($BCl_3$) gas: 60 sccm
Flow rate of chlorine ($Cl_2$): 20 sccm
Pressure in reaction chamber: 1.9 Pa
High-frequency power: 450 W
Bias power between upper electrode and lower electrode: 100 W Then, ashing was performed in an oxygen ($O_2$) atmosphere; after that, the second etching mask was removed.

Next, etching was performed until the first semiconductor film was exposed. Here, the detailed conditions for the etching were as follows.

Flow rate of carbon hydrogen bromide (HBr) gas: 125 sccm
Flow rate of sulfur hexafluoride ($SF_6$): 10 sccm
Flow rate of oxygen ($O_2$) gas: 5 sccm
Pressure in reaction chamber: 1.7 Pa
ICP power: 500 W
Bias power between upper electrode and lower electrode: 50 W Next, plasma treatment was performed using a water vapor ($H_2O$) gas on the exposed portion of the semiconductor layer formed using the first semiconductor film as in the case of the sample of Example 1.

Next, an insulating film to be the third insulating layer formed of 300-nm-thick silicon nitride was formed to cover the first semiconductor layer, the second semiconductor layers, the impurity semiconductor layer, the second conductive layer, and the second insulating layer by a plasma CVD method as in the case of the sample of Example 1.

Next, an etching mask was formed over the insulating film and the insulating film was etched using the etching mask to form an opening portion, so that a third insulating layer was formed. The opening portion was formed to overlap with a portion of the second conductive layer, which is to be a source electrode or a drain electrode.

Next, a conductive film to be a third conductive layer was formed over the second insulating layer by a sputtering method as is the case of the sample of Example. After that, an etching mask was formed over the conductive film and etching was performed, so that the third conductive layer was formed.

Note that both in the sample of Example 1 and the sample of the comparative example, the gate electrode formed using the first conductive layer is connected to a back gate electrode formed using the third conductive layer.

On-state current, off-state current, and field-effect mobility in the sample of Example 1 and the sample of the comparative example are shown in Table 1 below.

TABLE 1

| | Ion[µA] (Vg = 15 V) | Ioff[pA] (minimum value) | Ioff[pA] (Vg = Vg at the minimum value − 10 V) | µFE_sat. [$cm^2/V·s$] |
|---|---|---|---|---|
| Sample of Example 1 | 23.4 | 0.9 | 13.6 | 3.1 |
| sample of comparative example | 20.53 | 1.31 | 14.64 | 2.06 |

Note that $I_{off}$ ($V_g=V_g$ at the minimum value—10V) is off-state current when gate voltage $V_g$ was −10 V; $I_{off}$ (the minimum value) is the minimum value of the off-state current; $I_{on}$ ($V_g$=15V) is on-state current when the gate voltage $V_g$ was 15 V; and µFE_sat. is field-effect mobility.

According to one embodiment of the present invention, a semiconductor device can be obtained in which at least high field-effect mobility and on-state current are achieved. Further, reduction in off-state current can also be achieved.

This application is based on Japanese Patent Application serial no. 2010-189927 filed with Japan Patent Office on Aug. 26, 2010, the entire contents of which are hereby incorporated by reference.

What is claimed is:

1. A semiconductor device comprising:
a semiconductor layer over a substrate, the semiconductor layer comprising a first region, a second region and a third region, the second region being between the first region and the third region;
a first conductive layer over the first region;
a second conductive layer over the third region;
a first insulating layer over the first region, the third region, the first conductive layer and the second conductive layer;
a second insulating layer over the first region, the second region, the third region, the first conductive layer, the second conductive layer and the first insulating layer; and
a third conductive layer over the second insulating layer, the third conductive layer overlapping the second region,
wherein the first insulating layer is thicker than the second insulating layer, and wherein the second region is in contact with the second insulating layer.

2. The semiconductor device according to claim 1, wherein the third conductive layer has a light-transmitting property.

3. The semiconductor device according to claim 1, further comprising a third insulating layer between the first insulating layer and the second insulating layer.

4. The semiconductor device according to claim 1,
wherein the first region comprises a first impurity region comprising an impurity,
wherein the third region comprises a second impurity region comprising the impurity,
wherein the first impurity region is in contact with the first conductive layer, and
wherein the second impurity region is in contact with the second conductive layer.

5. The semiconductor device according to claim 1, further comprising a third insulating layer between the substrate and the semiconductor layer,
wherein the third insulating layer comprises silicon oxide.

6. The semiconductor device according to claim 1, further comprising a third insulating layer between the substrate and the semiconductor layer,
wherein the third insulating layer comprises silicon oxynitride.

7. The semiconductor device according to claim 3, further comprising a fourth insulating layer between the second insulating layer and the third conductive layer,
wherein the fourth insulating layer overlaps with a part of the second conductive layer.

8. The semiconductor device according to claim 1, wherein the semiconductor layer comprises a microcrystalline semiconductor.

9. An electronic appliance comprising the semiconductor device according to claim 1.

10. A semiconductor device comprising:
a semiconductor layer over a substrate, the semiconductor layer comprising a first region, a second region and a third region, the second region being between the first region and the third region;
a first conductive layer over the first region;
a second conductive layer over the third region;
a first insulating layer over the first region, the third region, the first conductive layer and the second conductive layer;
a second insulating layer over the first region, the second region, the third region, the first conductive layer, the second conductive layer and the first insulating layer; and
a third conductive layer over the second insulating layer, the third conductive layer overlapping the second region,
wherein the second region is in contact with the second insulating layer, and
wherein the semiconductor layer comprises a first semiconductor film and a second semiconductor film.

11. The semiconductor device according to claim 10, wherein the first insulating layer is thicker than the second insulating layer.

12. The semiconductor device according to claim 10, wherein the third conductive layer has a light-transmitting property.

13. The semiconductor device according to claim 10, further comprising a third insulating layer between the first insulating layer and the second insulating layer.

14. The semiconductor device according to claim 10,
wherein the first region comprises a first impurity region comprising an impurity,
wherein the third region comprises a second impurity region comprising the impurity,
wherein the first impurity region is in contact with the first conductive layer, and
wherein the second impurity region is in contact with the second conductive layer.

15. The semiconductor device according to claim 10, further comprising a third insulating layer between the substrate and the semiconductor layer,
wherein the third insulating layer comprises silicon oxide.

16. The semiconductor device according to claim 10, further comprising a third insulating layer between the substrate and the semiconductor layer,
wherein the third insulating layer comprises silicon oxynitride.

17. The semiconductor device according to claim 13, further comprising a fourth insulating layer between the second insulating layer and the third conductive layer,
wherein the fourth insulating layer overlaps with a part of the second conductive layer.

18. The semiconductor device according to claim 10, wherein the semiconductor layer comprises a microcrystalline semiconductor.

19. An electronic appliance comprising the semiconductor device according to claim 10.

* * * * *